(12) United States Patent
Takahashi et al.

(10) Patent No.: US 12,424,720 B2
(45) Date of Patent: Sep. 23, 2025

(54) MULTILAYER SUBSTRATE AND ELECTRONIC DEVICE

(71) Applicant: Murata Manufacturing Co., Ltd., Nagaokakyo (JP)

(72) Inventors: Hironobu Takahashi, Nagaokakyo (JP); Fumiya Isono, Nagaokakyo (JP); Kenji Matsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 229 days.

(21) Appl. No.: 18/371,591

(22) Filed: Sep. 22, 2023

(65) Prior Publication Data
US 2024/0014536 A1    Jan. 11, 2024

Related U.S. Application Data

(63) Continuation of application No. PCT/JP2022/024462, filed on Jun. 20, 2022.

(30) Foreign Application Priority Data

Jun. 28, 2021    (JP) .................. 2021-106440

(51) Int. Cl.
*H01P 3/08*   (2006.01)
*H05K 1/02*   (2006.01)

(52) U.S. Cl.
CPC ............. *H01P 3/08* (2013.01); *H05K 1/0219* (2013.01); *H05K 1/028* (2013.01); *H05K 2201/0723* (2013.01); *H05K 2201/09609* (2013.01)

(58) Field of Classification Search
CPC ......... H01P 3/08; H05K 1/0219; H05K 1/028
See application file for complete search history.

(56) References Cited

U.S. PATENT DOCUMENTS 5,334,800 A  *  8/1994  Kenney ................ H05K 1/0224
                                                   174/250
2016/0020500 A1* 1/2016 Matsuda .................. H05K 3/42
                                                   333/238

FOREIGN PATENT DOCUMENTS

JP            0555746 A    3/1993
JP         2006005134 A    1/2006
(Continued)

OTHER PUBLICATIONS

International Search Report in PCT/JP2022/024462, mailed Sep. 13, 2022, 3 pages.
(Continued)

*Primary Examiner* — Samuel S Outten
(74) *Attorney, Agent, or Firm* — Keating & Bennett, LLP

(57) ABSTRACT

In a first region, a multilayer body is bent along a first bending line such that a first main surface is located farther on an outer peripheral side than a second main surface. In a second region, the multilayer body is bent along a second bending line such that the first main surface is located farther on an inner peripheral side than the second main surface. In the first region, a first metal foil layer is located farther on an outer peripheral side than a center of the multilayer body. In the second region, a second metal foil layer is located farther on the outer peripheral side than the center of the multilayer body. In the second region, a distance between the second metal foil layer and the second main surface is shorter than a distance between the second metal foil layer and the first main surface.

20 Claims, 21 Drawing Sheets

(56) References Cited

FOREIGN PATENT DOCUMENTS

| JP | 2010227971 A | 10/2010 |
| JP | 2019143247 A | 8/2019 |
| WO | 2014065172 A1 | 5/2014 |
| WO | 2019194142 A1 | 10/2019 |

OTHER PUBLICATIONS

Written Opinion in PCT/JP2022/024462, mailed Sep. 13, 2022, 3 pages.

\* cited by examiner

Fig.1
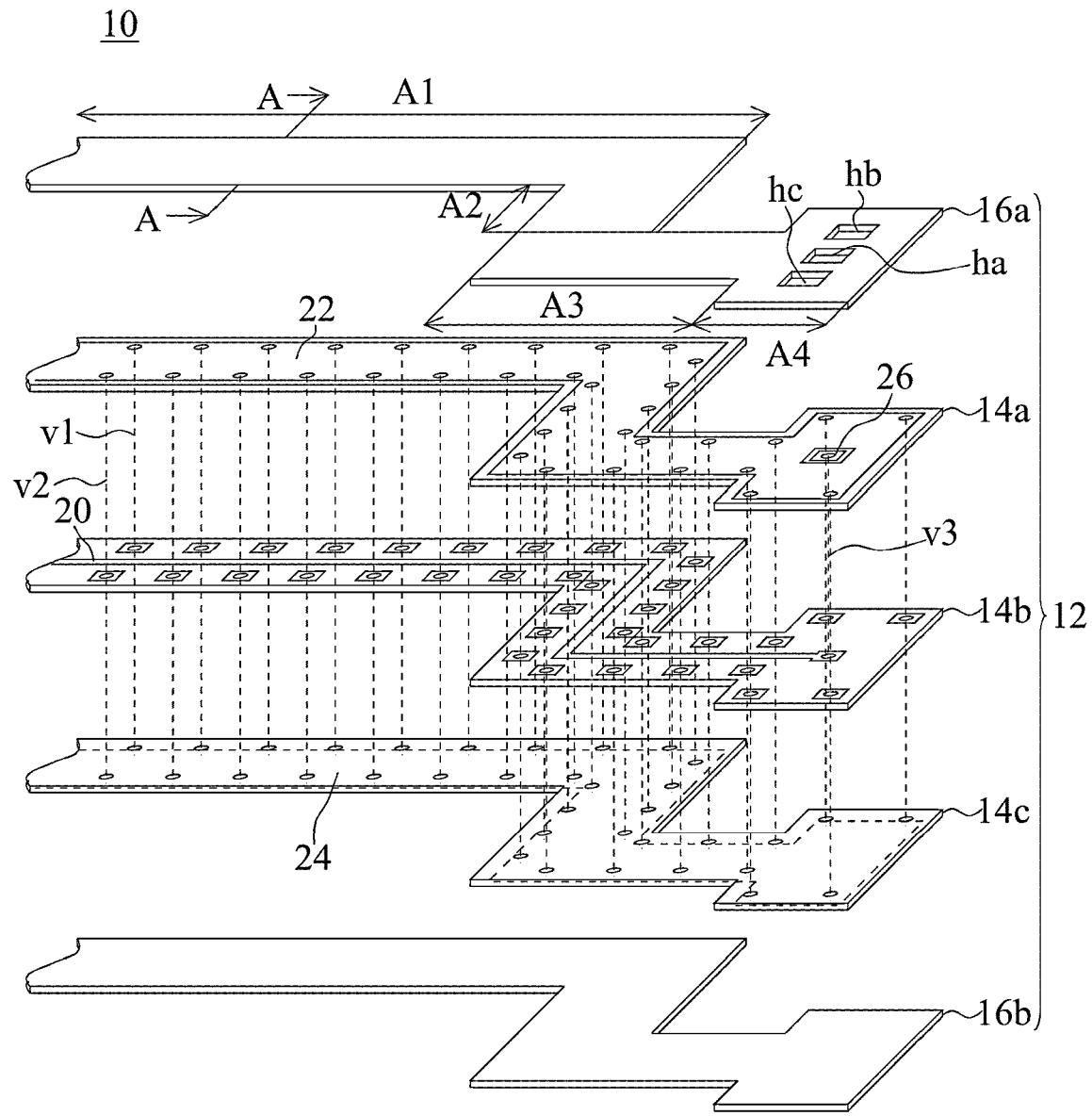
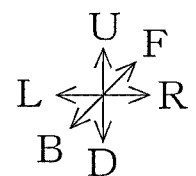

Fig.2
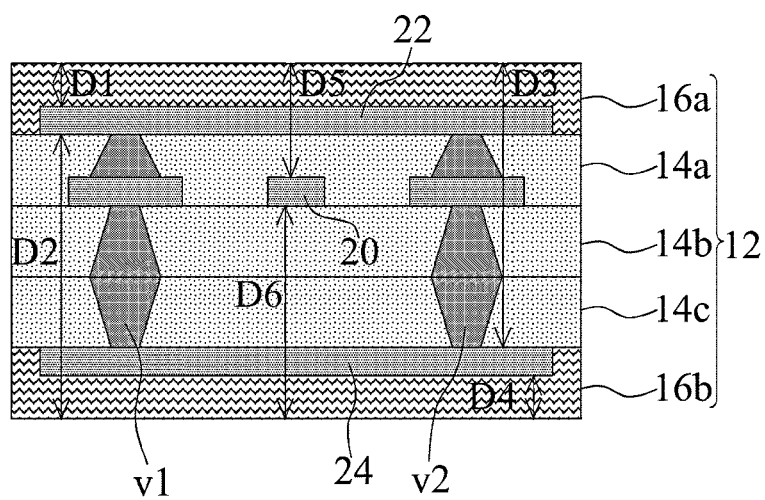
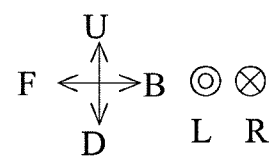

DIR1,DIR3

Fig.4
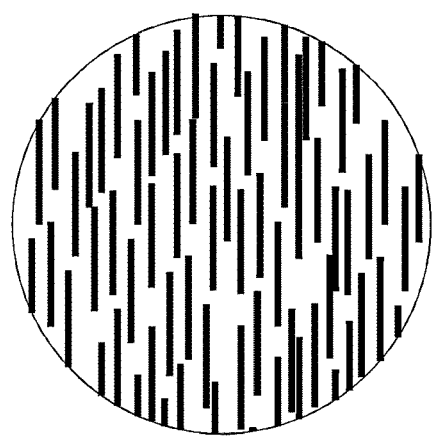
DIR2
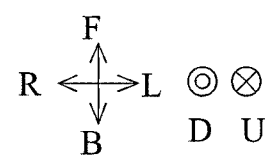

Fig.7
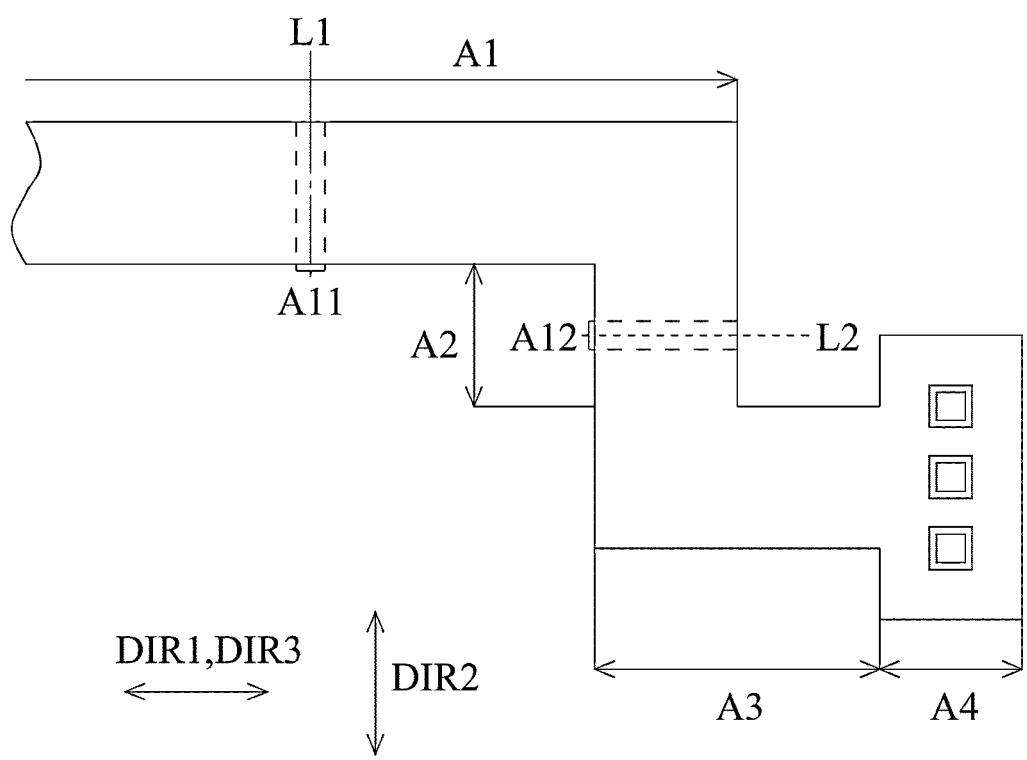
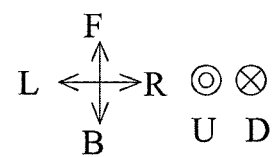

Fig.12
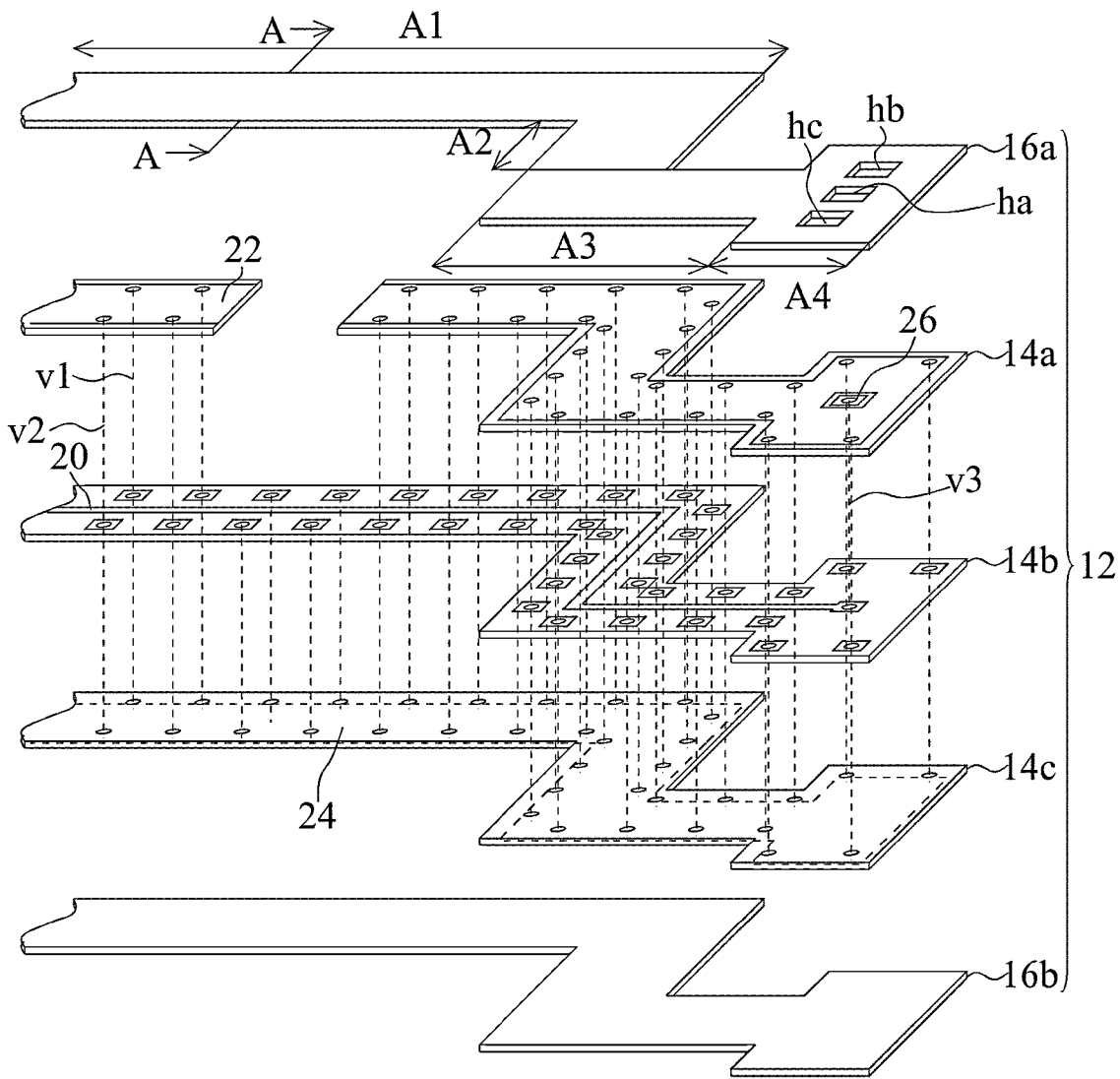
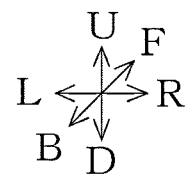

Fig.14
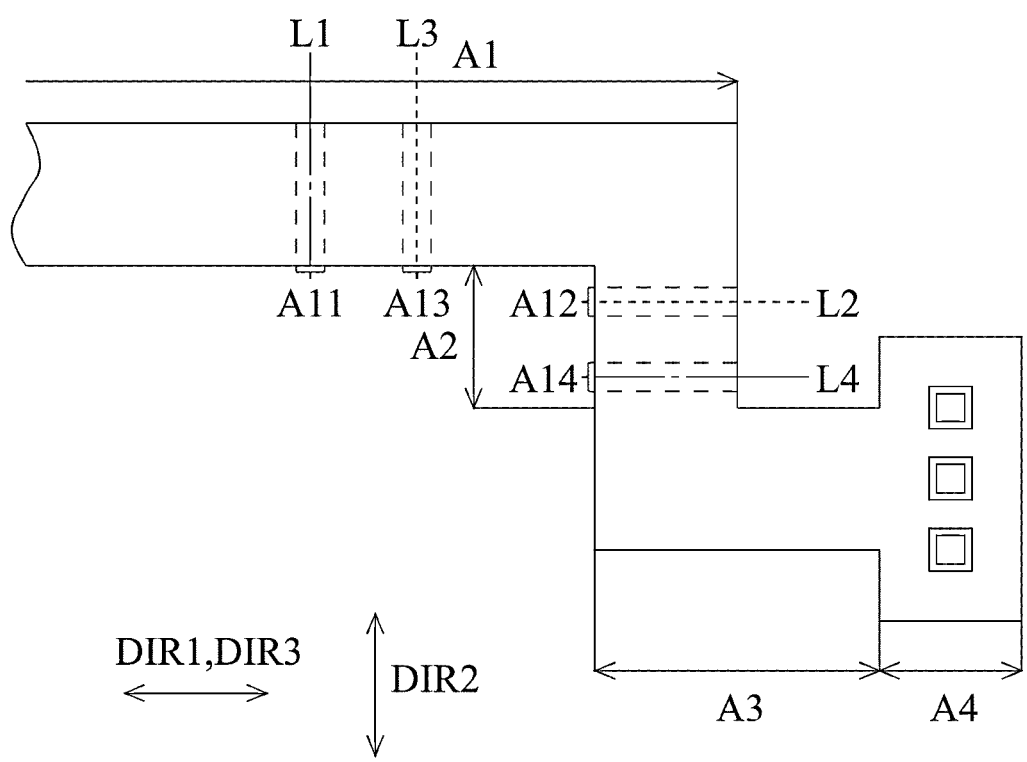
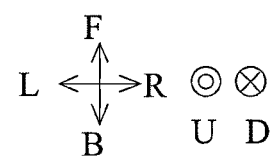

Fig.17
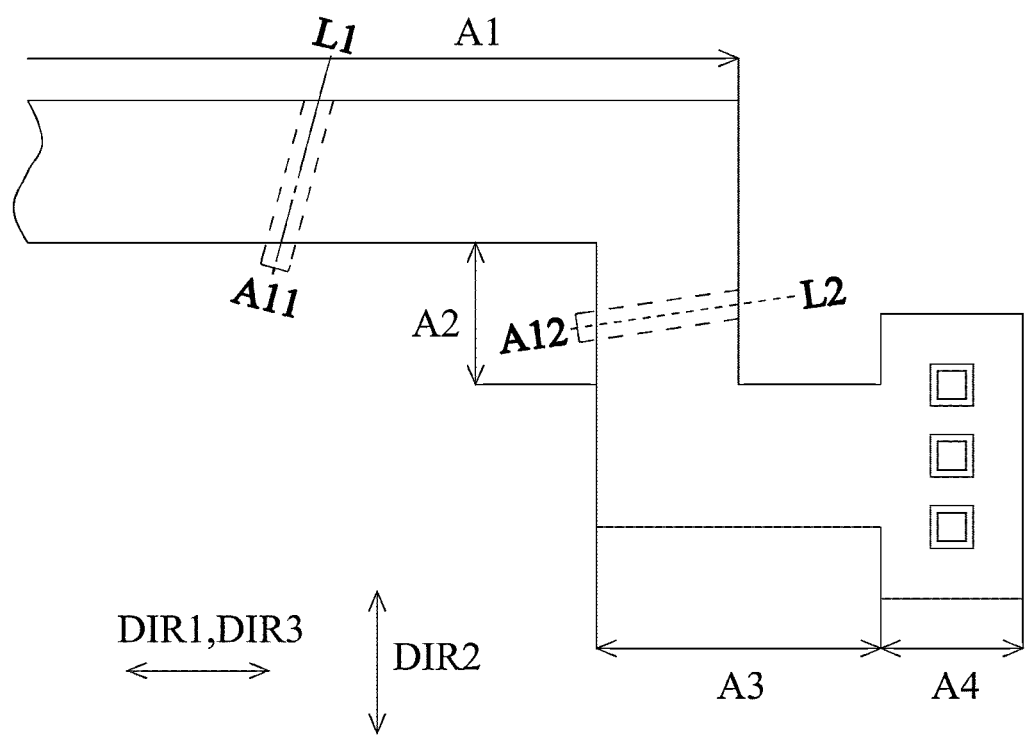
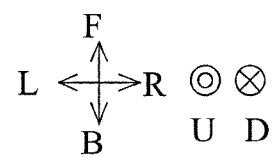

Fig.19
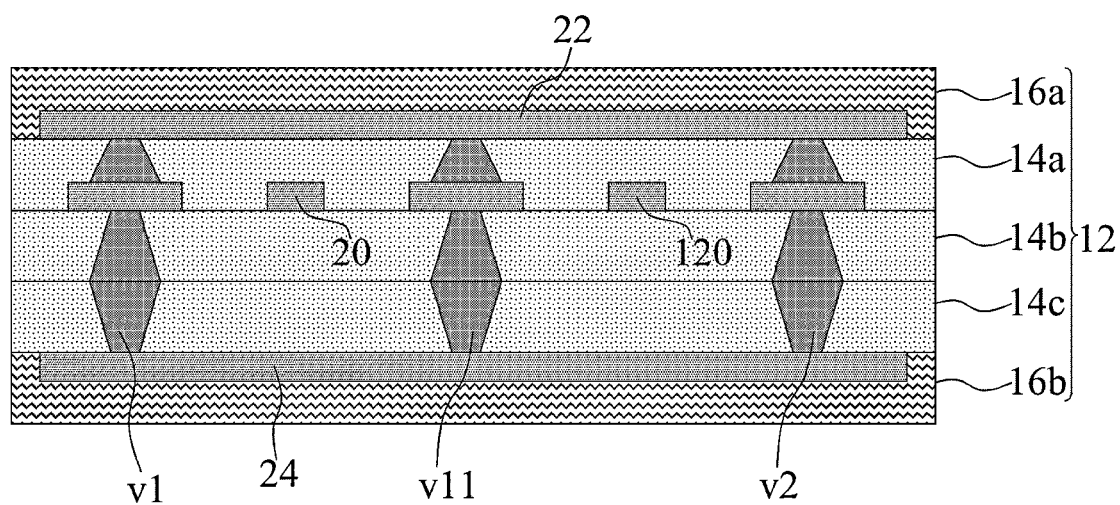
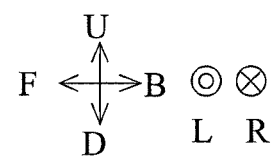

Fig.21
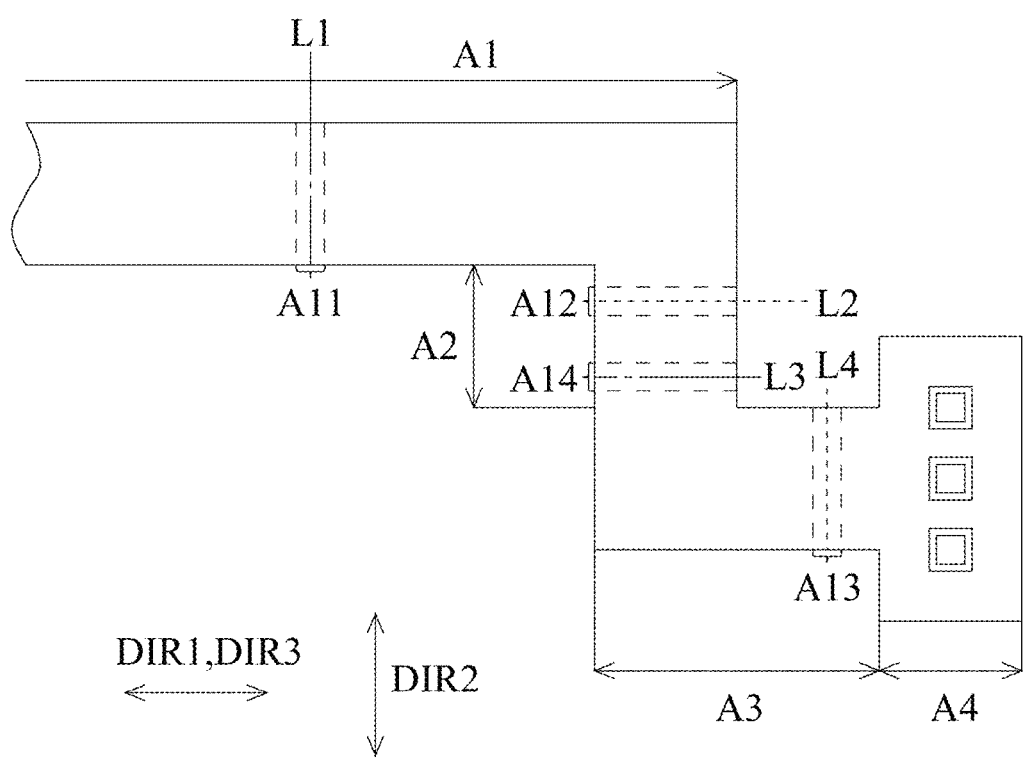
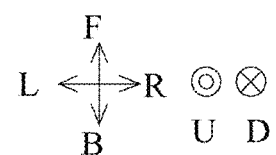

MULTILAYER SUBSTRATE AND ELECTRONIC DEVICE

CROSS REFERENCE TO RELATED APPLICATIONS

This application claims the benefit of priority to Japanese Patent Application No. 2021-106440 filed on Jun. 28, 2021 and is a Continuation application of PCT Application No. PCT/JP2022/024462 filed on Jun. 20, 2022. The entire contents of each application are hereby incorporated herein by reference.

BACKGROUND OF THE INVENTION

1. Field of the Invention

The present invention relates to a multilayer substrate having a structure in which a plurality of insulating layers is laminated.

2. Description of the Related Art

As an invention related to a conventional multilayer substrate, for example, the flexible printed circuit board described in Japanese Unexamined Patent Application Publication No. 2006-5134 has been known. The flexible printed circuit board is bent along two bending lines. The two bending lines extend in different directions.

SUMMARY OF THE INVENTION

The flexible printed circuit board described in Japanese Unexamined Patent Application Publication No. 2006-5134 includes a conductive material inside. In such a flexible printed circuit board, breakage of the conductive material is desirably suppressed when the flexible printed circuit board is bent.

Therefore, preferred embodiments of the present invention provide multilayer substrates and electronic devices each capable of reducing or preventing breakage of a metal foil layer.

A multilayer substrate according to a preferred embodiment of the present invention includes a multilayer body including a plurality of insulating layers laminated together, and a first main surface and a second main surface arranged in a laminating direction of the plurality of insulating layers, a first metal foil layer provided in the multilayer body and including a main surface on which a plurality of streaks extending in a first direction, when viewed in the laminating direction, is provided, and a second metal foil layer provided in the multilayer body and including a main surface on which a plurality of streaks extending in a second direction, which is different from the first direction, when viewed in the laminating direction, is provided, wherein the multilayer body includes a first region in which the multilayer body is bent along a first bending line such that the first main surface is located farther on an outer peripheral side than the second main surface, and a second region in which the multilayer body is bent along a second bending line such that the first main surface is located farther on an inner peripheral side than the second main surface, the second bending line is not parallel to the first bending line, in the first region, the first metal foil layer is located farther on an outer peripheral side than a center of the multilayer body in the laminating direction, in the second region, the second metal foil layer is located farther on the outer peripheral side than the center of the multilayer body in the laminating direction, in a state in which the multilayer body is shown on a plane, when viewed in the laminating direction, an angle defined by the first direction and the first bending line is larger than an angle defined by the first direction and the second bending line, and in a state in which the multilayer body is shown on a plane, when viewed in the laminating direction, an angle defined by the second direction and the second bending line is larger than an angle defined by the second direction and the first bending line.

A multilayer substrate according to a preferred embodiment of the present invention includes a multilayer body including a plurality of insulating layers laminated in a laminating direction, a first metal foil layer provided in the multilayer body and including a main surface on which a plurality of streaks extending in a first direction, when viewed in the laminating direction, is provided, and a second metal foil layer provided in the multilayer body and including a main surface on which a plurality of streaks extending in a second direction, which is different from the first direction, when viewed in the laminating direction, is provided, wherein the multilayer body is bent in the laminating direction.

According to the multilayer substrates according to preferred embodiments of the present invention, breakage of a metal foil layer can be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an exploded perspective view of a multilayer substrate 10.

FIG. 2 is a sectional view taken along line A-A of FIG. 1.

FIG. 4 is an enlarged view of a lower main surface of a reference conductor layer 24.

FIG. 7 is a top view of the multilayer substrate 10 in a state in which the multilayer body 12 is shown on a plane.

FIG. 12 is an exploded perspective view of a multilayer substrate 10b.

FIG. 14 is a top view of a multilayer substrate 10c.

FIG. 17 is a top view of a multilayer substrate 10d.

FIG. 19 is a sectional view along a first bending line L1 of the multilayer substrate 10e.

FIG. 21 is a top view of a multilayer substrate 10g.

DETAILED DESCRIPTION OF THE PREFERRED EMBODIMENTS

Preferred Embodiments

Structure of Multilayer Substrate

Figure 3:
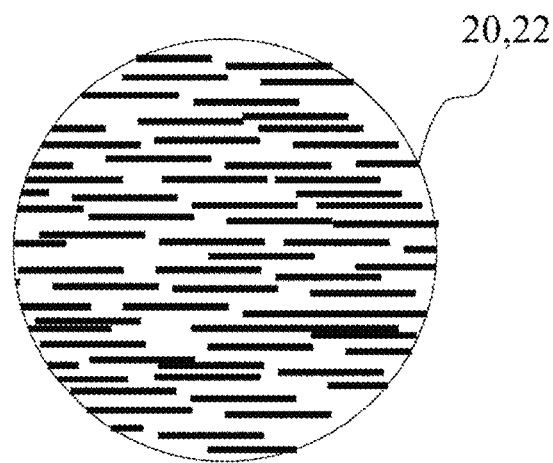
FIG. 3 is an enlarged view of an upper main surface of each of a signal conductor layer 20 and a reference conductor layer 22.
Figure 5:
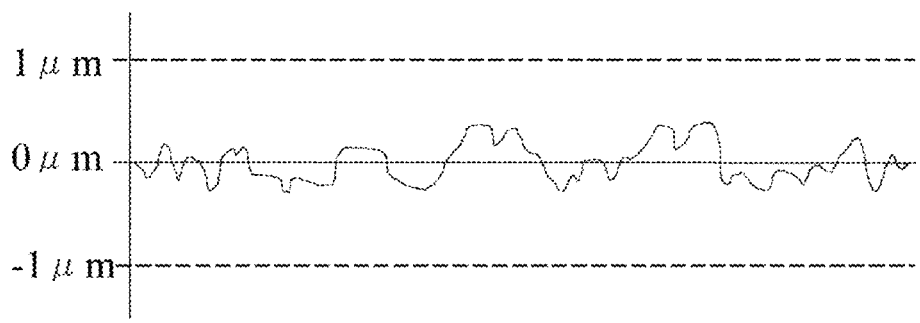
FIG. 5 is a sectional profile of a surface of each of the reference conductor layers 22 and 24.
Figure 6:
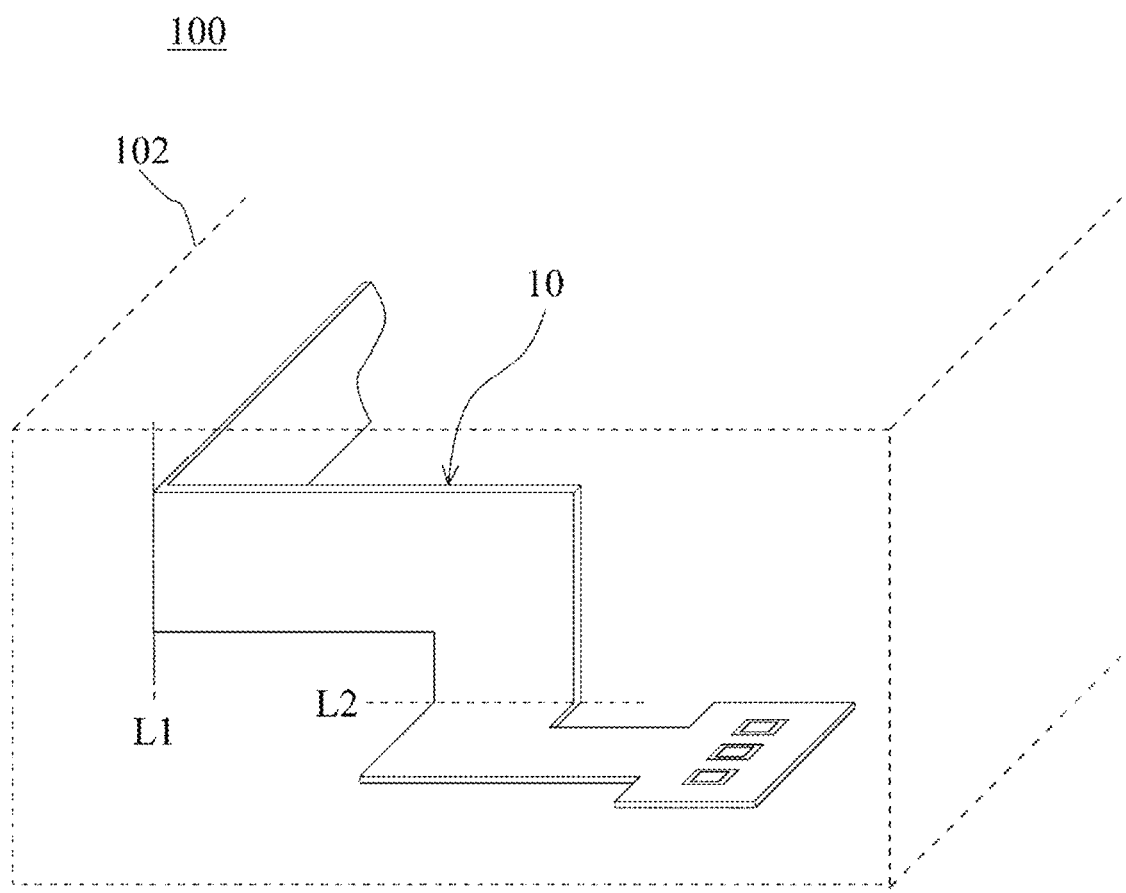
FIG. 6 is a perspective view of an electronic device 100 including the multilayer substrate 10 in a state in which a multilayer body 12 is bent.
Figure 8:
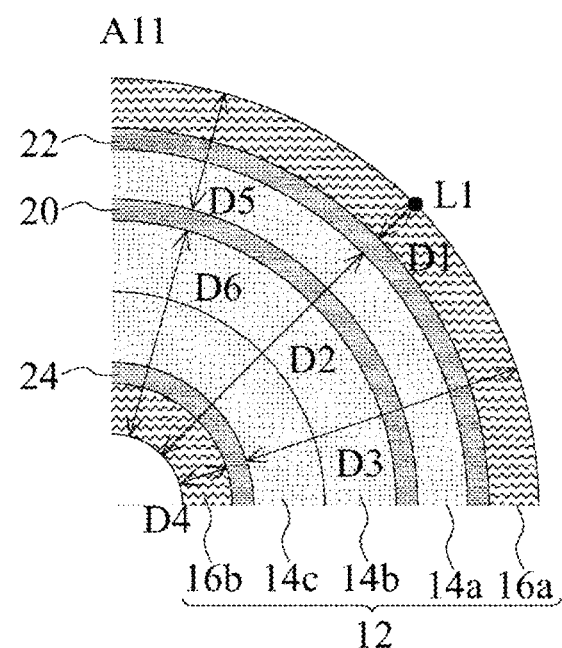
FIG. 8 is a sectional view of a first region A11.
Figure 9:
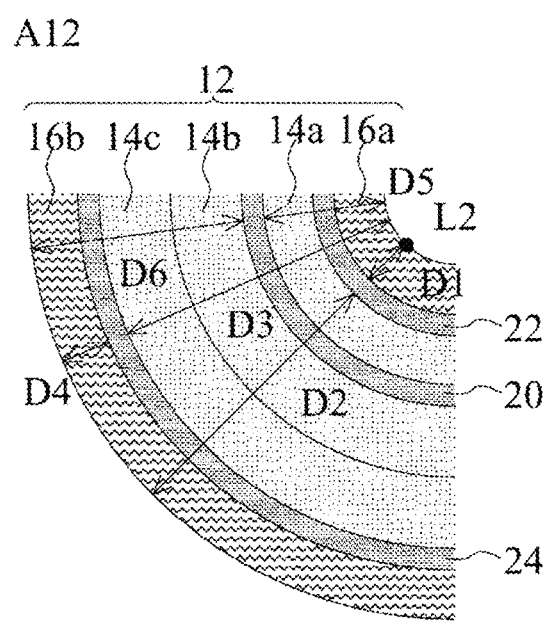
FIG. 9 is a sectional view of a second region A12.

Hereinafter, a structure of a multilayer substrate 10 according to a preferred embodiment of the present invention will be described with reference to the drawings. FIG. 1 is an exploded perspective view of the multilayer substrate 10. Note that in FIG. 1, among a plurality of interlayer connection conductors v1 and a plurality of interlayer connection conductors v2, only representative interlayer connection conductors v1 and v2 are denoted by reference numerals. FIG. 2 is a sectional view taken along line A-A of FIG. 1. FIG. 3 is an enlarged view of an upper main surface of each of a signal conductor layer 20 and a reference conductor layer 22. FIG. 4 is an enlarge view of a lower main surface of a reference conductor layer 24. FIG. 5 is a sectional profile of a surface of each of the reference conductor layers 22 and 24. FIG. 6 is a perspective view of an electronic device 100 including the multilayer substrate 10 in a state in which a multilayer body 12 is bent. FIG. 7 is a top view of the multilayer substrate 10 in a state in which the multilayer body 12 is shown on a plane. FIG. 8 is a sectional view of a first region A11. FIG. 9 is a sectional view of a second region A12.

In the specification, directions are defined as follows. A laminating direction in which a plurality of insulating layers 14a to 14c, 16a, and 16b is laminated is defined as an up-down direction. A left-right direction is orthogonal to the up-down direction. A direction orthogonal to the left-right direction and the up-down direction is defined as a front-back direction. Note that the up-down direction, the front-back direction, and the left-right direction in the present preferred embodiment do not have to coincide with the up-down direction, the front-back direction, and the left-right direction when the multilayer substrate 10 is used.

Hereinafter, X represents a component or a member of the multilayer substrate 10. In the specification, unless otherwise stated, each portion of X is defined as follows. A front portion of X means a front half portion of X. A rear portion of X means a rear half portion of X. A left portion of X means a left half portion of X. A right portion of X means a right half portion of X. An upper portion of X means an upper half portion of X. A lower portion of X means a lower half portion of X. A front end of X means an end in a front direction of X. A rear end of X means an end in a rear direction of X. A left end of X means an end in a left direction of X. A right end of X means an end in a right direction of X. An upper end of X means an end in an up direction of X. A lower end of X means an end in a down direction of X. A front end portion of X means the front end of X and the vicinity thereof. A rear end portion of X means the rear end of X and the vicinity thereof. A left end portion of X means the left end of X and the vicinity thereof. A right end portion of X means the right end of X and the vicinity thereof. An upper end portion of X means the upper end of X and the vicinity thereof. A lower end portion of X means the lower end of X and the vicinity thereof.

First, with reference to FIG. 1, the structure of the multilayer substrate 10 will be described. The multilayer substrate 10 transmits a radio frequency signal. The multilayer substrate 10 is used to electrically connect two circuits in an electronic device such as a smart phone. As illustrated in FIG. 1, the multilayer substrate 10 includes the multilayer body 12, the signal conductor layer 20 (a third metal foil layer), the reference conductor layer 22 (a first metal foil layer), the reference conductor layer 24 (a second metal foil layer), a signal terminal 26, the plurality of interlayer connection conductors v1, the plurality of interlayer connection conductors v2, and an interlayer connection conductor v3.

The multilayer body 12 has a plate shape including an upper main surface (a first main surface) and a lower main surface (a second main surface) arranged in the up-down direction (the laminating direction of the plurality of insulating layers). The multilayer body 12 includes a first section A1 to a fourth section A4. The first section A1 to the fourth section A4 are connected so as to be arranged in this order. The first section A1 has a belt shape extending in the left-right direction. The second section A2 is connected to the right end portion of the first section A1. The second section A2 has a belt shape extending in the back direction from the right end portion of the first section A1. The third section A3 is connected to the rear end portion of the second section A2. The third section A3 has a belt shape extending in the right direction from the rear end portion of the second section A2. The fourth section A4 is connected to the right end portion of the third section A3. The fourth section A4 has a rectangular shape when viewed in the up-down direction. The width of the fourth section A4 in the front-back direction is larger than the width of the third section A3 in the front-back direction.

The multilayer body 12 has a structure in which the insulating layers 14a to 14c, 16a, and 16b (the plurality of insulating layers) are laminated in the laminating direction. In the present preferred embodiment, the insulating layers 16a, 14a to 14c, and 16b are arranged from the top to the bottom in this order. The insulating layers 14a to 14c have the same shape as the multilayer body 12 when viewed in the up-down direction. The material of the insulating layers 14a to 14c is a thermoplastic resin. The thermoplastic resin is, for example, a thermoplastic resin such as a liquid crystal polymer, polytetrafluoroethylene(PTFE), or the like. The material of the insulating layers 14a to 14c may be polyimide.

The reference conductor layer 22 (the first metal foil layer) is provided in the multilayer body 12. The reference conductor layer 22 is located on the upper main surface of the insulating layer 14a. The reference conductor layer 22 is fixed to the upper main surface of the insulating layer 14a. As a result, as illustrated in FIG. 2, a distance D1 between the reference conductor layer 22 and the upper main surface (the first main surface) of the multilayer body 12 is shorter than a distance D2 between the reference conductor layer 22 (the first metal foil layer) and the lower main surface (the second main surface). The reference conductor layer 22 covers substantially the entire surface of the upper main surface of the insulating layer 14a. However, the reference conductor layer 22 is not in contact with the signal terminal 26 described later.

The reference conductor layer 24 (the second metal foil layer) is provided in the multilayer body 12. The reference conductor layer 24 is located on the lower main surface of the insulating layer 14c. The reference conductor layer 24 is fixed to the lower main surface of the insulating layer 14c. As a result, as illustrated in FIG. 2, a distance D4 between the reference conductor layer 24 and the lower main surface (the second main surface) of the multilayer body 12 is shorter than a distance D3 between the reference conductor layer 24 (the second metal foil layer) and the upper main surface (the first main surface). The reference conductor layer 24 covers substantially the entire surface of the lower main surface of the insulating layer 14c. The reference conductor layers 22 and 24 described above are connected to a reference potential. The reference potential is, for example, a ground potential.

The signal conductor layer 20 (the third metal foil layer) is provided in the multilayer body 12. The signal conductor layer 20 is located on the upper main surface of the insulating layer 14b. The signal conductor layer 20 is fixed to the upper main surface of the insulating layer 14b. As a result, as illustrated in FIG. 2, a distance D5 between the signal conductor layer 20 (the third metal foil layer) and the upper main surface (the first main surface) of the multilayer body 12 is shorter than a distance D6 between the signal conductor layer 20 (the third metal foil layer) and the lower main surface (the second main surface) of the multilayer body 12. When viewed in the up-down direction, the signal conductor layer 20 has a line shape extending along the multilayer body 12. The signal conductor layer 20 extends in the left-right direction in the center of the first section A1 in the front-back direction and in the center of the third section A3 in the front-back direction. The signal conductor layer 20 extends in the front-back direction in the center of the second section A2 in the left-right direction. The right end portion of the signal conductor layer 20 is located in the center of the fourth section A4 in the front-back direction and in the center of the fourth section A4 in the left-right direction.

The signal conductor layer 20 described above overlaps with the reference conductor layers 22 and 24 when viewed in the up-down direction. As a result, the signal conductor layer 20 and the reference conductor layers 22 and 24 define a strip line structure. Through the signal conductor layer 20 described above, a radio frequency signal is transmitted.

The signal terminal 26 is provided in the multilayer body 12. As illustrated in FIG. 1, the signal terminal 26 is located on the upper main surface of the insulating layer 14a. The signal terminal 26 is fixed to the upper main surface of the insulating layer 14a. The signal terminal 26 has a rectangular shape when viewed in the up-down direction. The signal terminal 26 overlaps with the right end portion of the signal conductor layer 20 when viewed in the up-down direction.

The signal conductor layer 20, the reference conductor layers 22 and 24, and the signal terminal 26 are formed by, for example, performing etching on a metal foil provided on the upper main surface or the lower main surface of the insulating layers 14b, 14a, and 14c. The metal foil is, for example, a copper foil. Such a metal foil is manufactured by causing metal to be precipitated on a drum. When streak-shaped recesses and projections extending in one direction exist on a surface of the drum, the streak-shaped recesses and projections are transferred on the metal foil formed on the drum. In the multilayer substrate the extending direction of the streak-shaped recesses and projections (hereinafter, referred to as streaks) is specified. In other words, recesses and projections extending in one direction are provided on the surfaces of the metal foils of the multilayer substrate 10. The streaks in the specification refer to line-shaped recesses extending in one direction. The width of each streak is substantially smaller than a length of the streak. The length of the streak is a size of the streak in one direction. The width of the streak is the size of the streak in a direction orthogonal to the one direction. The width of the streak being substantially small means, for example, the width of the streak being equal to or less than one-tenth of the length of the streak. Such a streak is, for example, described in Japanese Unexamined Patent Application Publication No. 2019-143247.

As illustrated in FIG. 3, when viewed in the up-down direction (the laminating direction), a plurality of streaks extending in a first direction DIR1 is provided on the upper main surface of the reference conductor layer 22 (the first metal foil layer) and the upper main surface of the signal terminal 26. In the present preferred embodiment, the first direction DIR1 is the left-right direction. The plurality of streaks is provided on the entire upper main surface of the reference conductor layer 22 (the first metal foil layer) and the entire upper main surface of the signal terminal 26. As illustrated in FIG. 4, when viewed in the up-down direction (the laminating direction), a plurality of streaks extending in a second direction DIR2, which is different from the first direction DIR1, is provided on the lower main surface of the reference conductor layer 24 (the second metal foil layer). In the present preferred embodiment, the second direction DIR2 is the front-back direction. The plurality of streaks is provided on the entire lower main surface of the reference conductor layer 24 (the second metal foil layer). As illustrated in FIG. 3, when viewed in the up-down direction (the laminating direction), a plurality of streaks extending in a third direction DIR3 is provided on the upper main surface of the signal conductor layer 20 (the third metal foil layer). In the present preferred embodiment, the third direction DIR3 is the left-right direction. The plurality of streaks is provided on the entire upper main surface of the signal conductor layer 20 (the third metal foil layer).

By the following method, the plurality of streaks provided on each of the reference conductor layers 22 and 24 can be confirmed in the following direction. The reference conductor layers 22 and 24 are observed at a magnification of 20 times with a laser microscope. At this time, the plurality of streaks has the following dimensions, for example.

Width of streak: about 5 μm
Depth of streak: about 1 μm to about 2 μm
Length of streak: about 5 μm to about 60 μm
Intervals between adjacent streaks: Random In addition, the sectional profile of each of the reference conductor layers 22 and 24 has the structure illustrated in the FIG. 5. The surface of each of the reference conductor layers 22 and 24 has recesses and projections in a range of about ±1 μm with respect to the reference height, for example.

As illustrated FIG. 1, the interlayer connection conductor v3 electrically connects the signal conductor layer 20 to the signal terminal 26. The interlayer connection conductor v3 penetrates the insulating layer 14a in the up-down direction. The upper end of the interlayer connection conductor v3 is in contact with the signal terminal 26. The lower end of the interlayer connection conductor v3 is in contact with the signal conductor layer 20.

The plurality of interlayer connection conductors v1 and the plurality of interlayer connection conductors v2 electrically connect the reference conductor layer 22 to the reference conductor layer 24. The plurality of interlayer connection conductors v1 and the plurality of interlayer connection conductors v2 penetrate the insulating layers 14a to 14c in the up-down direction. The upper end of the plurality of interlayer connection conductors v1 and the upper end of the plurality of interlayer connection conductors v2 are in contact with the reference conductor layer 22. The lower end of the plurality of interlayer connection conductors v1 and the lower end of the plurality of interlayer connection conductors v2 are in contact with the reference conductor layer 24.

The plurality of interlayer connection conductors v1 is arranged at equal intervals along the signal conductor layer 20. The plurality of interlayer connection conductors v1 is located in front of the signal conductor layer 20 in the first section A1 and the third section A3. The plurality of interlayer connection conductors v1 is located on the right of the signal conductor layer in the second section A2.

The plurality of interlayer connection conductors v2 is arranged at equal intervals along the signal conductor layer 20. The plurality of interlayer connection conductors v2 is located behind the signal conductor layer 20 in the first section A1 and the third section A3. The plurality of interlayer connection conductors v2 is located on the left of the signal conductor layer in the second section A2.

The plurality of interlayer connection conductors v1, the plurality of interlayer connection conductors v2, and the interlayer connection conductor v3 are formed when through holes provided in the insulating layers 14a to 14c are filled with a conductive paste and the conductive paste is heated and solidified.

The insulating layer 16a is laminated on the insulating layer 14a. The insulating layer 16a covers the reference conductor layer 22 so as to protect the reference conductor layer 22. The upper main surface of the insulating layer 16a is the upper main surface of the multilayer body 12. However, in the fourth section A4 of the insulating layer 16a, openings ha to hc are provided. The openings hb, ha, and hc are arranged in this order from the front to the back. The signal terminal 26 is exposed from the multilayer body 12 to the outside through the opening ha. A portion of the reference conductor layer 22 is exposed from the multilayer body 12 to the outside through the openings hb and hc. The signal terminal 26 is connected to a signal terminal of a circuit board (not illustrated) by solder. A portion of the reference conductor layer 22 is connected to a reference terminal of a circuit board (not illustrated) by solder.

The insulating layer 16b is laminated below the insulating layer 14c. The insulating layer 16b covers the reference conductor layer 24 so as to protect the reference conductor layer 24. The lower main surface of the insulating layer 16b is the lower main surface of the multilayer body 12.

The material of the insulating layers 16a and 16b is different from the material of the insulating layers 14a to 14c. The insulating layers 16a and 16b may be formed through printing of a conductive paste or may be formed through sticking of a conductive sheet.

As illustrated in FIG. 6, the multilayer substrate 10 described above is bent at a plurality of locations. In more detail, as illustrated in FIG. 7, the multilayer body 12 includes the first region A11 and the second region A12. As illustrated in FIG. 8, the first region A11 has a structure in which the multilayer body 12 is bent along a first bending line L1 such that the upper main surface (the first main surface) of the multilayer body 12 is located farther on an outer peripheral side than the lower main surface (the second main surface) of the multilayer body 12. The first bending line L1 extends in the front-back direction. Therefore, the first bending line L1 is orthogonal to the left-right direction in which the first section A1 extends in a state in which the multilayer substrate 10 is shown. In addition, in the specification, the multilayer body 12 being bent means that the multilayer body 12 being deformed after an external force is applied to the multilayer body 12. The deformation may be plastic deformation or elastic deformation, or plastic deformation and elastic deformation.

As illustrated in FIG. 9, the second region A12 has a structure in which the multilayer body 12 is bent along a second bending line L2 such that the upper main surface (the first main surface) of the multilayer body 12 is located farther on an inner peripheral side than the lower main surface (the second main surface) of the multilayer body 12. As illustrated in FIG. 7, the second bending line L2 is not parallel to the first bending line L1. In the present preferred embodiment, the second bending line L2 extends in the left-right direction. Therefore, the second bending line L2 is orthogonal to the front-back direction in which the second section A2 extends in a state in which the multilayer substrate 10 is shown.

As illustrated in FIGS. 8 and 9, in the first region A11 and the second region A12, the distance D1 between the reference conductor layer 22 (the first metal foil layer) and the upper main surface (the first main surface) of the multilayer body 12 is shorter than the distance D2 between the reference conductor layer 22 (the first metal foil layer) and the lower main surface (the second main surface) of the multilayer body 12. As a result, in the first region A11, the reference conductor layer 22 (the first metal foil layer) is located farther on the outer peripheral side than the center of the multilayer body 12 in the laminating direction. As illustrated in FIGS. 8 and 9, in the first region A11 and the second region A12, the distance D4 between the reference conductor layer 24 and the lower main surface (the second main surface) of the multilayer body 12 is shorter than the distance D3 between the reference conductor layer 24 (the second metal foil layer) and the upper main surface (the first main surface). As a result, in the second region A12, the reference conductor layer 24 (the second metal foil layer) is located farther on the outer peripheral side than the center of the multilayer body 12 in the laminating direction.

In addition, as illustrated in FIGS. 8 and 9, in the first region A11 and the second region A12, the distance D5 between the signal conductor layer 20 (the third metal foil layer) and the upper main surface (the first main surface) of the multilayer body 12 is shorter than the distance D6 between the signal conductor layer 20 (the third metal foil layer) and the lower main surface (the second main surface) of the multilayer body 12. As a result, in the first region A11, the signal conductor layer 20 (the third metal foil layer) is located farther on the outer peripheral side than the center of the multilayer body 12 in the laminating direction. In the second region A12, the signal conductor layer (the third metal foil layer) is located farther on the inner peripheral side than the center of the multilayer body 12 in the laminating direction.

In addition, when viewed in the up-down direction (the laminating direction), a plurality of streaks extending in the first direction DIR1 is provided on the upper main surface of the reference conductor layer 22 (the first metal foil layer). The plurality of streaks is provided on the entire upper main surface of the reference conductor layer 22. The first direction DIR1 is the left-right direction. The first bending line L1 extends in the front-back direction. The second bending line L2 extends in the left-right direction. Therefore, in a state in which the multilayer body 12 is shown on a plane, when viewed in the up-down direction (the laminating direction), the first direction DIR1 intersects with the first bending line L1. In a state in which the multilayer body 12 is shown on a plane, when viewed in the up-down direction (the laminating direction), the second direction DIR2 intersects with the second bending line L2. In a state in which the multilayer body 12 is shown on a plane, when viewed in the up-down direction (the laminating direction), an angle θ11 defined by the first direction DIR1 and the first bending line L1 is 90°. On the other hand, in a state in which the multilayer body 12 is shown on a plane, when viewed in the up-down direction (the laminating direction), an angle θ12 defined by the first direction DIR1 and the second bending line L2 is 0°. From the above, in a state in which the multilayer body 12 is shown on a plane, when viewed in the up-down direction (the laminating direction), the angle θ11 defined by the first direction DIR1 and the first bending line L1 is larger than the angle θ12 defined by the first direction DIR1 and the second bending line L2. A line located on the upper main surface of the reference conductor layer 22 and parallel to the first bending line L1 is likely to intersect with the plurality of streaks provided on the upper main surface of the reference conductor layer 22. On the other hand, a line located on the upper main surface of the reference conductor layer 22 and parallel to the second bending line L2 is less likely to intersect with the plurality of streaks provided on the upper main surface of the reference conductor layer 22. Therefore, a line that becomes a measurement range for surface roughness is set to have a length intersecting with the plurality of streaks provided on the upper main surface of the reference conductor layer 22. As a result, the surface roughness of the upper main surface of the reference conductor layer 22 in a direction parallel to the first bending line L1 is larger than the surface roughness of the upper main surface of the reference conductor layer 22 in a direction parallel to the second bending line L2. The surface roughness can be measured by, for example, a contact type stylus profilometer or a non-contact laser microscope.

The surface roughness is measured by the following steps. First, a sample is prepared. The insulating layers 16a and 16b are removed so as to expose the reference conductor layers 22 and 24. The insulating layers 16a and 16b may be removed by dissolving the insulating layers 16a and 16b in a solvent or by scraping off the insulating layers 16a and 16b.

The sample is fixed to the stage through suction. Then, a surface of each of the reference conductor layers 22 and 24 of the sample is observed by a laser microscope. The surface roughness the reference conductor layers 22 and 24 on thirty different observation lines is measured. The length of each observation line is about 10 μm to about 150 μm, for example. The average value of the thirty observation lines is calculated. By using analysis software, inclination correction is performed. Then, the average value of the height of the entire measurement surface is set to 0 μm (see FIG. 5).

In addition, when viewed in the up-down direction (the laminating direction), a plurality of streaks extending in the second direction DIR2 is provided on the lower main surface of the reference conductor layer 24 (the second metal foil layer). The plurality of streaks is provided on the entire lower main surface of the reference conductor layer 24. The second direction DIR2 is the front-back direction. The first bending line L1 extends in the front-back direction. The second bending line L2 extends in the left-right direction. Therefore, in a state in which the multilayer body 12 is shown on a plane, when viewed in the up-down direction (the laminating direction), an angle θ22 defined by the second direction DIR2 and the second bending line L2 is 90°. In a state in which the multilayer body 12 is shown on a plane, when viewed in the up-down direction (the laminating direction), an angle θ21 defined by the second direction DIR2 and the first bending line L1 is 0°. From the above, in a state in which the multilayer body 12 is shown on a plane, when viewed in the up-down direction (the laminating direction), the angle θ22 defined by the second direction DIR2 and the second bending line L2 is larger than the angle θ21 defined by the second direction DIR2 and the first bending line L1. As a result, the surface roughness of the lower main surface of the reference conductor layer 24 in a direction parallel to the second bending line L2 is larger than the surface roughness of the lower main surface of the reference conductor layer 24 in a direction parallel to the first bending line L1.

In addition, when viewed in the up-down direction (the laminating direction), a plurality of streaks extending in the third direction DIR3 is provided on the upper main surface of the signal conductor layer 20 (the third metal foil layer). The plurality of streaks is provided on the entire upper main surface of the signal conductor layer 20. The third direction DIR3 is the left-right direction. The first bending line L1 extends in the front-back direction. The second bending line L2 extends in the left-right direction. Therefore, in a state in which the multilayer body 12 is shown on a plane, when viewed in the up-down direction (the laminating direction), an angle θ31 defined by the third direction DIR3 and the first bending line L1 is 90°. In a state in which the multilayer body 12 is shown on a plane, when viewed in the up-down direction (the laminating direction), an angle θ32 defined by the third direction DIR3 and the second bending line L2 is 0°. In a state in which the multilayer body 12 is shown on a plane, when viewed in the up-down direction (the laminating direction), the angle θ31 defined by the third direction DIR3 and the first bending line L1 is larger than the angle θ32 defined by the third direction DIR3 and the second bending line L2. As a result, the surface roughness of the upper main surface of the signal conductor layer 20 in a direction parallel to the first bending line L1 is larger than the surface roughness of the upper main surface of the signal conductor layer 20 in a direction parallel to the second bending line L2.

In addition, the surface roughness of the main surface of the reference conductor layer 22 (the first metal foil layer) and the surface roughness of the main surface of the reference conductor layer 24 (the second metal foil layer) are smaller than the surface roughness of the main surface of the signal conductor layer 20 (the third metal foil layer). In more detail, the surface roughness of the upper main surface of the reference conductor layer 22, the surface roughness of the lower main surface of the reference conductor layer 22, the surface roughness of the upper main surface of the reference conductor layer 24, and the surface roughness of the lower main surface of the reference conductor layer 24 are smaller than the surface roughness of the upper main surface of the signal conductor layer 20 and the surface roughness of the lower main surface of the signal conductor layer 20. In particular, the surface roughness of the upper main surface of the reference conductor layer 22 and the surface roughness of the lower main surface of the reference conductor layer 24 are smaller than the surface roughness of the upper main surface of the signal conductor layer 20. The surface roughness here is the surface roughness in a square having a predetermined size.

The multilayer substrate 10 described above is used as a portion of the electronic device 100, as illustrated in FIG. 6. The electronic device 100 includes the multilayer substrate 10 and a housing 102. The housing 102 accommodates the multilayer substrate 10. The electronic device 100 is a wireless communication terminal such as a smart phone.

Effects

According to the multilayer substrate 10, breakage of the reference conductor layers 22 and 24 can be reduced or prevented. In more detail, a plurality of streaks extending in one direction is provided on the upper main surface of the reference conductor layer 22 and the lower main surface of the reference conductor layer 24. When angles defined by the bending lines of the reference conductor layers 22 and 24 and the direction in which the plurality of streaks extends are reduced, the reference conductor layers 22 and 24 are more likely to break. In particular, large tensile stress is applied to reference conductors located on the outer peripheral sides in the reference conductor layers 22 and 24. Therefore, angles defined by the bending lines of the reference conductor layers 22 and 24 and the direction in which the plurality of streaks, which is provided on the reference conductors located on the outer peripheral sides in the reference conductor layers 22 and 24, extends are reduced, the reference conductors located on the outer peripheral sides in the reference conductor layers 22 and 24 are more likely to break.

Here, in the multilayer substrate 10, the multilayer body 12 is bent in the laminating direction. The multilayer body 12 is bent along the first bending line L1 and the second bending line L2. Specifically, in the first region A11, the multilayer body 12 is bent along the first bending line L1 such that the upper main surface of the multilayer body 12 is located farther on the outer peripheral side than the lower main surface of the multilayer body 12. In the second region A12, the multilayer body 12 is bent along the second bending line L2 such that the upper main surface of the multilayer body 12 is located farther on the inner peripheral side than the lower main surface of the multilayer body 12. In the first region A11, the distance D1 between the reference conductor layer 22 and the upper main surface of the multilayer body 12 is shorter than the distance D2 between the reference conductor layer 22 and the lower main surface of the multilayer body 12. In the first region A11, the reference conductor layer 22 (the first metal foil layer) is located farther on the outer peripheral side than the center of the multilayer body 12 in the laminating direction. Therefore, in the first region A11, large tensile stress is applied to the reference conductor layer 22. In the second region A12, the distance D4 between the reference conductor layer 24 and the lower main surface of the multilayer body 12 is shorter than the distance D3 between the reference conductor layer 24 and the upper main surface of the multilayer body 12. In the second region A12, the reference conductor layer 24 (the second metal foil layer) is located farther on the outer peripheral side than the center of the multilayer body 12 in the laminating direction. Therefore, in the second region A12, large tensile stress is applied to the reference conductor layer 24.

Therefore, in a state in in which the multilayer body 12 is shown on a plane, when viewed in the up-down direction, the angle θ11 defined by the first direction DIR1 and the first bending line L1 is larger than the angle θ12 defined by the first direction DIR1 and the second bending line L2. As a result, in the first region A11, even when large tensile stress is applied to the reference conductor layer 22, breakage of the reference conductor layer 22 is reduced or prevented. Similarly, in a state in which the multilayer body 12 is shown on a plane, when viewed in the up-down direction, the angle θ22 defined by the second direction DIR2 and the second bending line L2 is larger than the angle θ21 defined by the second direction DIR2 and the first bending line L1. As a result, in the second region A12, even when large tensile stress is applied to the reference conductor layer 24, breakage of the reference conductor layer 24 is reduced or prevented. When breakage of the reference conductor layers 22 and 24 is reduced or prevented, generation of cracks in the reference conductor layers 22 and 24 is reduced or prevented. As a result, deterioration of noise suppression effects by the reference conductor layers 22 and 24 is reduced or prevented.

Note that confirmation of the first direction DIR1 and confirmation of the second direction DIR2, and measurement of the surface roughness of the upper main surface of the reference conductor layer 22 and measurement of the surface roughness of the lower main surface of the reference conductor layer 24 are performed by, for example, removing the insulating layers 16a and 16b by dissolving the insulating layers 16a and 16b in a solvent.

In addition, according to the multilayer substrate 10, breakage of the signal conductor layer 20 is reduced or prevented. In more detail, in the first region A11, the distance D5 between the signal conductor layer 20 and the upper main surface of the multilayer body 12 is shorter than the distance D6 between the signal conductor layer 20 and the lower main surface of the multilayer body 12. In the first region A11, the signal conductor layer 20 (the third metal foil layer) is located farther on the outer peripheral side than the center of the multilayer body 12 in the laminating direction. Therefore, in the first region A11, large tensile stress is applied to the signal conductor layer 20. In particular, since the signal conductor layer 20 has a thin line width, the signal conductor layer 20 easily breaks. Therefore, in a state in which the multilayer body 12 is shown on a plane, when viewed in the up-down direction, the angle θ31 defined by the third direction DIR3 and the first bending line L1 is larger than the angle θ32 defined by the third direction DIR3 and the second bending line L2. As a result, in the first region A11, even when large tensile stress is applied the signal conductor layer 20, breakage of the signal conductor layer 20 having a thin line width is effectively reduced or prevented.

In addition, the surface roughness of the main surface of the reference conductor layer 22 (the first metal foil layer) and the surface roughness of the main surface of the reference conductor layer 24 (the second metal foil layer) are smaller than the surface roughness of the main surface of the signal conductor layer 20 (the third metal foil layer). In particular, the surface roughness of the upper main surface of the reference conductor layer 22 and the surface roughness of the lower main surface of the reference conductor layer 24 are smaller than the surface roughness of the upper main surface of the signal conductor layer 20. As a result, when the multilayer substrate 10 is bent, the reference conductor layers 22 and 24 are less likely to break.

In addition, according to the multilayer substrate 10, the material of the insulating layers 14a to 14c is a thermoplastic resin. Therefore, the multilayer body 12 can be easily plastically deformed.

First Modification

Figure 10:
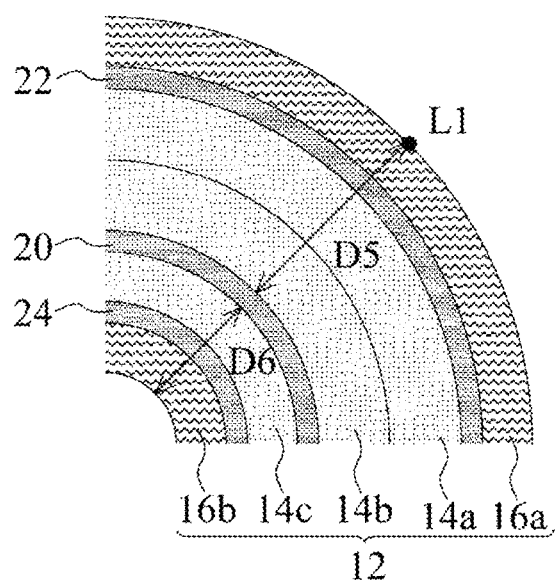
FIG. 10 is a sectional view of the first region A11.
Figure 11:
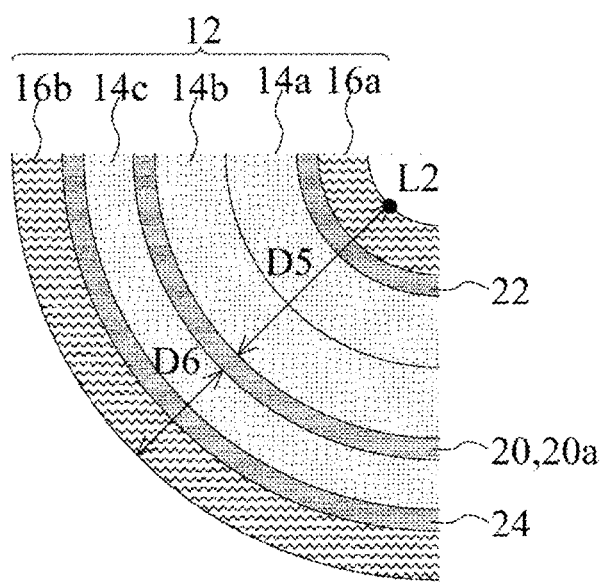
FIG. 11 is a sectional view of the second region A12.

Hereinafter, a multilayer substrate 10a according to a first modification of a preferred embodiment of the present invention will be described with reference to the drawings. FIG. 10 is a sectional view of the first region A11. FIG. 11 is a sectional view of the second region A12.

The multilayer substrate 10a is different from the multilayer substrate 10 in the location of the signal conductor layer 20, and the third direction DIR3 in which a plurality of streaks, which is provided on the lower main surface of the signal conductor layer 20, extends. In more detail, the signal conductor layer 20 is located on the lower main surface of the insulating layer 14b. The signal conductor layer 20 is fixed to the lower main surface of the insulating layer 14b. As a result, in the first region A11 and the second region A12, the distance D6 between the signal conductor layer 20 (the third metal foil layer) and the lower main surface (the second main surface) of the multilayer body 12 is shorter than the distance D5 between the signal conductor layer 20 (the third metal foil layer) and the upper main surface (the first main surface) of the multilayer body 12. In the first region A11, the signal conductor layer 20 (the third metal foil layer) is located farther on the inner peripheral surface side than the center of the multilayer body 12 in the laminating direction. In the second region A12, the signal conductor layer 20 (the third metal foil layer) is located farther on the outer peripheral side than the center of the multilayer body 12 in the laminating direction.

In addition, when viewed in the up-down direction (the laminating direction), the plurality of streaks extending in the third direction DIR3 is provided on the lower main surface of the signal conductor layer 20 (the third metal foil layer). The plurality of streaks is provided on the entire lower main surface of the signal conductor layer 20. The third direction DIR3 is the front-back direction. In addition, in a state in which the multilayer body 12 is shown on a plane, when viewed in the up-down direction (the laminating direction), the angle θ32 defined by the third direction DIR3 and the second bending line L2 is larger than the angle θ31 defined by the third direction DIR3 and the first bending line L1. As a result, the surface roughness of the lower main surface of the signal conductor layer 20 in a direction parallel to the second bending line L2 is larger than the surface roughness of the lower main surface of the signal conductor layer in a direction parallel to the first bending line L1. Other structures of the multilayer substrate 10a are the same as the structures of the multilayer substrate 10, and thus the description will be omitted. The multilayer substrate 10a can exhibit the same effects as the multilayer substrate 10.

In addition, according to the multilayer substrate 10a, breakage of the signal conductor layer 20 is reduced or prevented. In more detail, in the second region A12, the distance D6 between the signal conductor layer 20 and the lower main surface of the multilayer body 12 is shorter than the distance D5 between the signal conductor layer 20 and the upper main surface of the multilayer body 12. In the second region A12, the signal conductor layer 20 is located farther on the outer peripheral side than the center of the multilayer body 12 in the laminating direction. Therefore, in the second region A12, large tensile stress is applied to the signal conductor layer 20. Therefore, in a state in which the multilayer body 12 is shown on a plane, when viewed in the up-down direction, the angle θ32 defined by the third direction DIR3 and the second bending line L2 is larger than the angle θ31 defined by the third direction DIR3 and the first bending line L1. As a result, even when large tensile stress is applied to the signal conductor layer 20, breakage of the signal conductor layer 20 is reduced or prevented.

Second Modification

Figure 13:
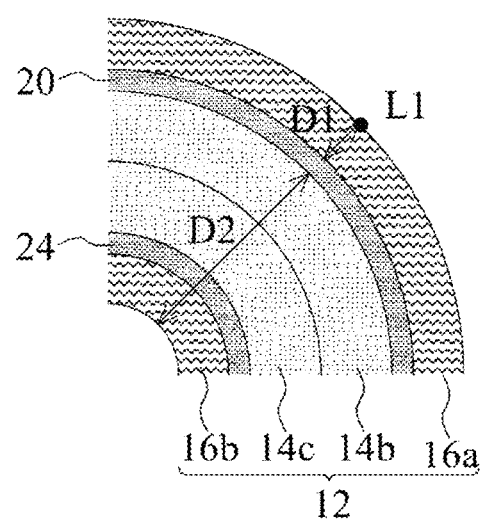
FIG. 13 is a sectional view of the first region A11.

Hereinafter, a multilayer substrate 10b according to a second modification of a preferred embodiment of the present invention will be described with reference to the drawings. FIG. 12 is an exploded perspective view of the multilayer substrate 10b. FIG. 13 is a sectional view of the first region A11. FIG. 7 is referred to for a top view of the multilayer substrate 10b in a state in which the multilayer body 12 is shown on a plane. The multilayer substrate 10b is different from the multilayer substrate 10 in that one portion of the insulating layer 14a is not provided. In more detail, in one portion of the first section A1, the insulating layer 14a and the reference conductor layer 22 do not exist. In addition, the first bending line L1 and the first region A11 are located in the portion where the insulating layer 14a and the reference conductor layer 22 do not exist in the first section A1.

In the first region A11, the distance D1 between the signal conductor layer 20 (the first metal foil layer) and the upper main surface (the first main surface) of the multilayer body 12 is shorter than the distance D2 between the signal conductor layer 20 (the first metal foil layer) and the lower main surface (the second main surface) of the multilayer body 12. In the first region A11, the signal conductor layer 20 (the first metal foil layer) is located farther on the outer peripheral side than the center of the multilayer body 12 in the laminating direction. When viewed in the up-down direction (the laminating direction), a plurality of streaks extending in the first direction DIR1 is provided on the upper main surface of the signal conductor layer 20 (the first metal foil layer). The plurality of streaks is provided on the entire upper main surface of the signal conductor layer 20. The first direction DIR1 is the left-right direction. In addition, in a state in which the multilayer body 12 is shown on a plane, when viewed in the up-down direction (the laminating direction), the angle θ11 defined by the first direction DIR1 and the first bending line L1 is larger than the angle θ12 defined by the first direction DIR1 and the second bending line L2. As a result, the surface roughness of the upper main surface of the signal conductor layer 20 in a direction parallel to the first bending line L1 is larger than the surface roughness of the upper main surface of the signal conductor layer 20 in a direction parallel to the second bending line L2. Other structures of the multilayer substrate 10b are the same as the structures of the multilayer substrate 10, and thus the description will be omitted.

In addition, according to the multilayer substrate 10b, breakage of the signal conductor layer 20 is reduced or prevented. In more detail, in the first region A11, the distance D1 between the signal conductor layer 20 and the upper main surface of the multilayer body 12 is shorter than the distance D2 between the signal conductor layer 20 and the lower main surface of the multilayer body 12. In the first region A11, the signal conductor layer 20 (the first metal foil layer) is located farther on the outer peripheral side than the center of the multilayer body 12 in the laminating direction. Therefore, in the first region A11, large tensile stress is applied to the signal conductor layer 20. Therefore, in a state in which the multilayer body 12 is shown on a plane, when viewed in the up-down direction, the angle θ11 defined by the first direction DIR1 and the first bending line L1 is larger than the angle θ12 defined by the first direction DIR1 and the second bending line L2. As a result, even when large tensile stress is applied to the signal conductor layer 20, breakage of the signal conductor layer 20 is reduced or prevented.

In addition, according to the multilayer substrate 10b, the thickness of the multilayer body 12 in the up-down direction (the laminating direction) in the first region A11 is smaller than the thickness of the multilayer body 12 in the up-down direction (the laminating direction) at least in a portion of the region excluding the first region A11 and the second region A12. Therefore, the multilayer body 12 can be easily bent in the first region A11.

Note that in the multilayer substrate 10b, when viewed in the up-down direction (the laminating direction), a plurality of streaks extending in a fifth direction DIR5 is provided on the upper main surface of the reference conductor layer 22. The plurality of streaks is provided on the entire upper main surface of the reference conductor layer 22. The fifth direction DIR5 is the front-back direction. As a result, in the second region A12, breakage of the reference conductor layer 22 is suppressed. As described above, since the reference conductor layer 22 is not provided in the first region A11, the fifth direction DIR5 in which the plurality of streaks provided on the entire upper main surface of the reference conductor layer 22 extends is set as a direction in which breakage of the reference conductor layer 22 along the second bending line L2 is reduced or prevented.

Third Modification

Figure 15:
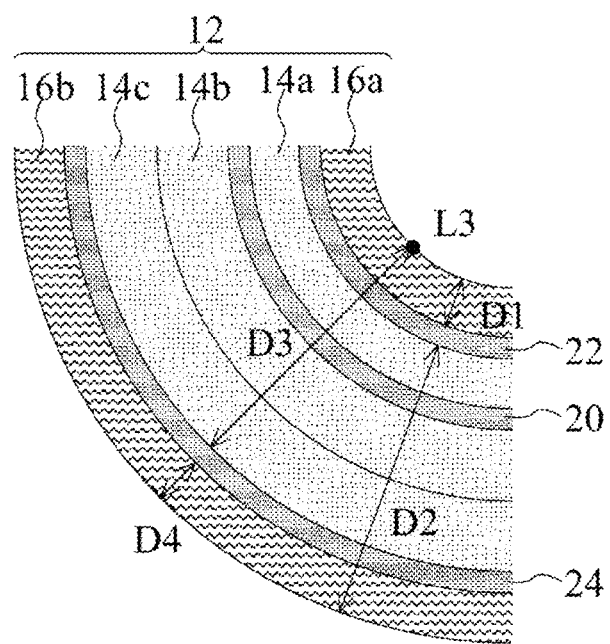
FIG. 15 is a sectional view of a third region A13.
Figure 16:
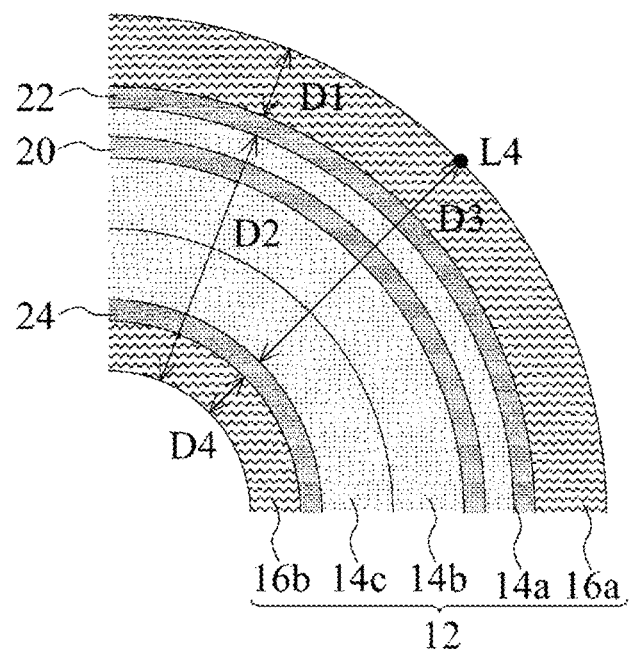
FIG. 16 is a sectional view of a fourth region A14.

Hereinafter, a multilayer substrate 10c according to a third modification of a preferred embodiment of the present invention will be described with reference to the drawings. FIG. 14 is a top view of the multilayer substrate 10c. FIG. 15 is a sectional view of a third region A13. FIG. 16 is a sectional view of a fourth region A14.

The multilayer substrate 10c is different from the multilayer substrate 10 in that the multilayer substrate 10c is bent along the first bending line L1, the second bending line L2, a third bending line L3, and a fourth bending line L4. In more detail, the multilayer body 12 has the third region A13 and the fourth region A14. The third region A13 has a structure in which the multilayer body 12 is bent along the third bending line L3 such that the lower main surface (the second main surface) of the multilayer body 12 is located farther on the outer peripheral side than the upper main surface (the first main surface) of the multilayer body 12. The third bending line L3 and the third region A13 are located in the first section A1. The third bending line L3 extends in the front-back direction. However, the curvature radius of the third region A13 is larger than the curvature radius of the first region A11. That is, the third region A13 is bent more gently than the first region A11. In addition, the curvature radius of the third region A13 is larger than the curvature radius of the second region A12. That is, the third region A13 is bent more gently than the second region A12.

The fourth region A14 has a structure in which the multilayer body 12 is bent along the fourth bending line L4 such that the upper main surface (the first main surface) of the multilayer body 12 is located farther on the outer peripheral side than the lower main surface (the second main surface) of the multilayer body 12. The fourth bending line L4 and the fourth region A14 are located in the second section A2. The fourth bending line L4 extends in the left-right direction. The curvature radius of the fourth region A14 is larger than the curvature radius of the second region A12. That is, the fourth region A14 is bent more gently than the second region A12. The curvature radius of the fourth region A14 is larger than the curvature radius of the first region A11. That is, the fourth region A14 is bent more gently than the first region A11.

In addition, in the third region A13, the distance D4 between the reference conductor layer 24 (the second metal foil layer) and the lower main surface (the second main surface) of the multilayer body 12 is shorter than the distance D3 between the reference conductor layer 24 (the second metal foil layer) and the upper main surface (the first main surface) of the multilayer body 12. In the third region A13, the reference conductor layer 24 (the second metal foil layer) is located farther on the outer peripheral side than the center of the multilayer body 12 in the laminating direction.

In the fourth region A14, the distance D1 between the reference conductor layer 22 (the first metal foil layer) and the upper main surface (the first main surface) of the multilayer body 12 is shorter than the distance D2 between the reference conductor layer 22 (the first metal foil layer) and the lower main surface (the second main surface) of the multilayer body 12. In the fourth region A14, the reference conductor layer 22 (the first metal foil layer) is located farther on the outer peripheral side than the center of the multilayer body 12 in the laminating direction.

When viewed in the up-down direction (the laminating direction), a plurality of streaks extending in the first direction DIR1 is provided on the upper main surface of the reference conductor layer 22 (the first metal foil layer) and the upper main surface of the signal terminal 26. The plurality of streaks is provided on the entire upper main surface of the reference conductor layer 22 and the entire upper main surface of the signal terminal 26. In the present preferred embodiment, the first direction DIR1 is the left-right direction. When viewed in the up-down direction (the laminating direction), a plurality of streaks extending in the second direction DIR2 is provided on the lower main surface of the reference conductor layer 24 (the second metal foil layer). The plurality of streaks is provided on the entire lower main surface of the reference conductor layer 24. In the present preferred embodiment, the second direction DIR2 is the front-back direction. Therefore, in a state in which the multilayer body 12 is shown on a plane, when viewed in the up-down direction (the laminating direction), an angle θ23 defined by the second direction DIR2 and the third bending line L3 is smaller than an angle θ22 defined by the second direction DIR2 and the second bending line L2. As a result, the surface roughness of the lower main surface of the reference conductor layer 24 in a direction parallel to the third bending line L3 is smaller than the surface roughness of the lower main surface of the reference conductor layer 24 in a direction parallel to the second bending line L2.

In a state in in which the multilayer body 12 is shown on a plane, when viewed in the up-down direction (the laminating direction), an angle θ14 defined by the first direction DIR1 and the fourth bending line L4 is smaller than the angle θ11 defined by the first direction DIR1 and the first bending line L1. As a result, the surface roughness of the upper main surface of the reference conductor layer 22 in a direction parallel to the fourth bending line L4 is smaller than the surface roughness of the upper main surface of the reference conductor layer 22 in a direction parallel to the first bending line L1. Other structures of the multilayer substrate 10c are the same as the structures of the multilayer substrate 10, and thus the description will be omitted.

According to the multilayer substrate 10c, breakage of the reference conductor layer 24 is reduced or prevented. In more detail, in the third region A13, the distance D4 between the reference conductor layer 24 (the second metal foil layer) and the lower main surface (the second main surface) of the multilayer body 12 is shorter than the distance D3 between the reference conductor layer 24 (the second metal foil layer) and the upper main surface (the first main surface) of the multilayer body 12. In the third region A13, the reference conductor layer 24 (the second metal foil layer) is located farther on the outer peripheral side than the center of the multilayer body 12 in the laminating direction. Therefore, in the third region A13, large tensile stress is applied to the reference conductor layer 24. In addition, when viewed in the up-down direction (the laminating direction), the plurality of streaks extending in the second direction DIR2 is provided on the lower main surface of the reference conductor layer 24 (the second metal foil layer). The plurality of streaks is provided on the entire lower main surface of the reference conductor layer 24. The second direction DIR2 is the front-back direction. The second bending line L2 extends in the left-right direction. The third bending line L3 extends in the front-back direction. Therefore, in a state in which the multilayer body 12 is shown on a plane, when viewed in the up-down direction (the laminating direction), the angle θ23 defined by the second direction DIR2 and the third bending line L3 is smaller than the angle θ22 defined by the second direction DIR2 and the second bending line L2. Therefore, in the third region A13, the reference conductor layer 24 may break. Therefore, in the multilayer substrate 10c, the curvature radius of the third region A13 is larger than the curvature radius of the first region A11. In addition, the curvature radius of the third region A13 is larger than the curvature radius of the second region A12. As a result, in the third region A13, tensile stress applied to the reference conductor layer 24 in the third region A13 is reduced. As a result, according to the multilayer substrate 10c, breakage of the reference conductor layer 24 can be reduced or prevented. Similarly, in the multilayer substrate 10c, the curvature radius of the fourth region A14 is larger than the curvature radius of the second region A12. In addition, the curvature radius of the fourth region A14 is larger than the curvature radius of the first region A11. As a result, tensile stress applied to the reference conductor layer 22 in the fourth region A14 is reduced. As a result, according to the multilayer substrate 10c, breakage of the reference conductor layer 22 can be reduced or prevented.

Fourth Modification

Hereinafter, a multilayer substrate 10d according to a fourth preferred embodiment of the present invention will be described with reference to the drawings. FIG. 17 is a top view of the multilayer substrate 10d.

The multilayer substrate 10d is different from the multilayer substrate 10 in the direction in which the first bending line L1 extends and the direction in which the second bending line L2 extends. In more detail, the first bending line L1 is inclined clockwise with respect to the front-back direction. The second bending line L2 is inclined counterclockwise with respect to the left-right direction. However, in a state in which the multilayer body 12 is shown on a plane, when viewed in the up-down direction (the laminating direction), the angle θ11 defined by the first direction DIR1 and the first bending line L1 is larger than the angle θ12 defined by the first direction DIR1 and the second bending line L2. As a result, the surface roughness of the upper main surface of the reference conductor layer 22 in a direction parallel to the first bending line L1 is larger than the surface roughness of the upper main surface of the reference conductor layer 22 in a direction parallel to the second bending line L2. In a state in which the multilayer body 12 is shown on a plane, when viewed in the up-down direction (the laminating direction), the angle θ22 defined by the second direction DIR2 and the second bending line L2 is larger than the angle θ21 defined by the second direction DIR2 and the first bending line L1. As a result, the surface roughness of the lower main surface of the reference conductor layer 24 in a direction parallel to the second bending line L2 is larger than the surface roughness of the lower main surface of the reference conductor layer 24 in a direction parallel to the first bending line L1. Other structures of the multilayer substrate 10d are the same as the structures of the multilayer substrate 10, and thus the description will be omitted. The multilayer substrate 10d can exhibit the same effects as the multilayer substrate 10.

Fifth Modification

Figure 18:
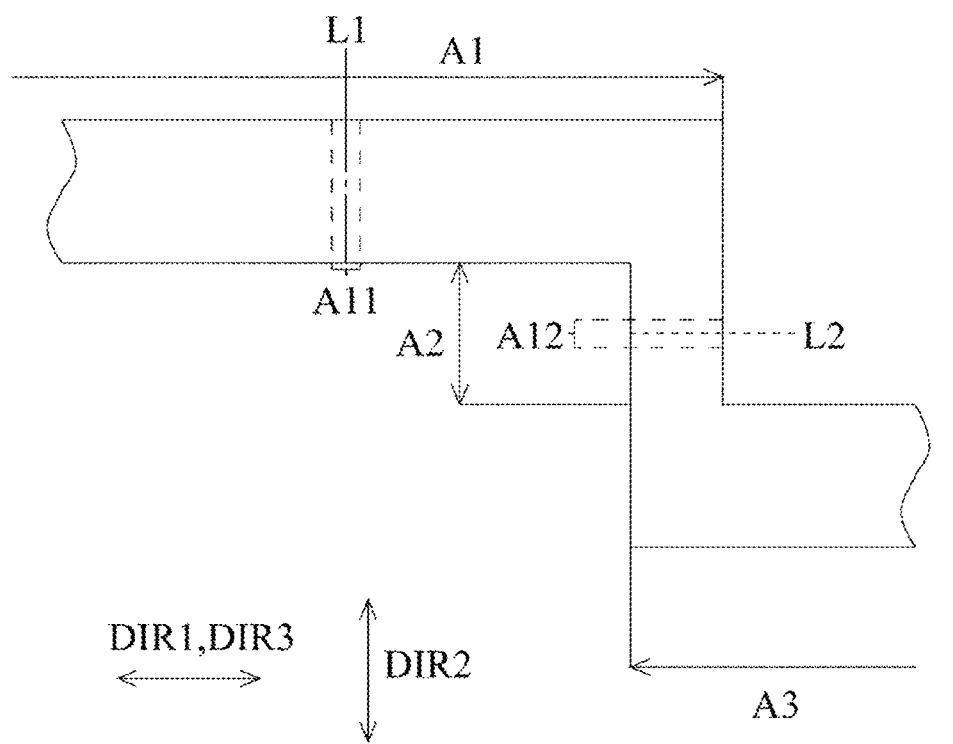
FIG. 18 is a top view of a multilayer substrate 10e.
Figure 20:
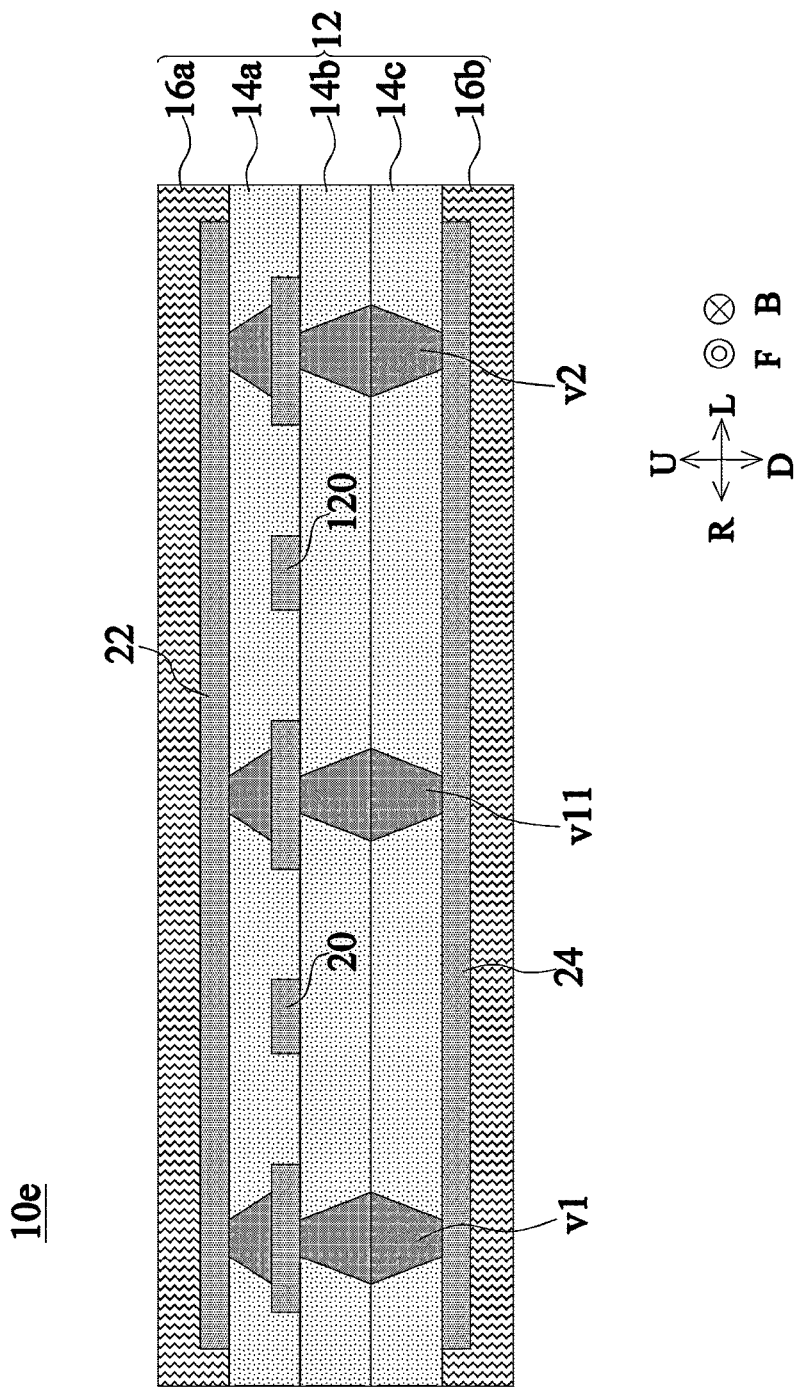
FIG. 20 is a sectional view along a second bending line L2 of the multilayer substrate 10e.

Hereinafter, a multilayer substrate 10e according to a fifth preferred embodiment of a preferred embodiment of the present invention will be described with reference to the drawings. FIG. 18 is a top view of the multilayer substrate 10e. FIG. 19 is a sectional view taken along the first bending line L1 of the multilayer substrate 10e. FIG. 20 is a sectional view taken along the second bending line L2 of the multilayer substrate 10e.

The multilayer substrate 10e is different from the multilayer substrate 10 in that a signal conductor layer 120 and a plurality of interlayer connection conductors vii are further included. The signal conductor layer 120 is provided in the multilayer body 12. The signal conductor layer 120 is located on the upper main surface of the insulating layer 14b. The signal conductor layer 120 is fixed to the upper main surface of the insulating layer 14b. The signal conductor layer 120 is parallel to the signal conductor layer 20. In the first section A1, the signal conductor layer 120 is located behind the signal conductor layer 20.

In the second section A2, the signal conductor layer 120 is located on the left of the signal conductor layer 20. In the third section A3, the signal conductor layer 120 is located behind the signal conductor layer 20.

The plurality of interlayer connection conductors vii electrically connects the reference conductor layer 22 to the reference conductor layer 24. The plurality of interlayer connection conductors vii penetrates the insulating layers 14a to 14c in the up-down direction. The upper end of the plurality of interlayer connection conductors vii is in contact with the reference conductor layer 22. The lower end of the plurality of interlayer connection conductors vii is in contact with the reference conductor layer 24.

The plurality of interlayer connection conductors vii is arranged at equal intervals along the signal conductor layers 20 and 120. When viewed in the up-down direction, the plurality of interlayer connection conductors vii is located between the signal conductor layer 20 and the signal conductor layer 120.

In the multilayer substrate 10e described above, the width of the multilayer substrate 10e in the front-back direction along the first bending line L1 is larger than the width of the multilayer substrate 10e in the left-right direction along the second bending line L2. Therefore, arrangement can be made such that the distance between the signal conductor layer 20 and the interlayer connection conductors vi and vii along the first bending line L1 is longer than the distance between the signal conductor layer 20 and the interlayer connection conductors vi and vii along the second bending line L2. As a result, the capacitance generated between the signal conductor layer 20 and the interlayer connection conductors vi and vii along the first bending line L1 is smaller than the capacitance generated between the signal conductor layer and the interlayer connection conductors vi and vii along the second bending line L2. Therefore, the widths of the signal conductor layers 20 and 120 along the first bending line L1 is larger than the widths of the signal conductor layers 20 and 120 along the second bending line L2. As a result, variation in the capacitance generated in the signal conductor layer 20 is suppressed, and variation in the characteristic impedance generated in the signal conductor layer 20 is reduced or prevented. For the same reason, variation in the capacitance generated in the signal conductor layer 120 is reduced or prevented, and variation in the characteristic impedance generated in the signal conductor layer 120 is reduced or prevented. Other structures of the multilayer substrate 10e are the same as the structures of the multilayer substrate 10, and thus the description will be omitted. The multilayer substrate 10e can exhibit the same effects as the multilayer substrate 10.

Sixth Modification

Hereinafter, a multilayer substrate 10f according to a sixth modification of a preferred embodiment of the present invention will be described with reference to the drawings. FIGS. 8 and 11 are referred to for sectional views of the multilayer substrate 10f.

The multilayer substrate 10f is different from the multilayer substrate 10 in that the multilayer substrate 10f includes signal conductor layers 20 and 20a. The signal conductor layer 20 (the third metal foil layer) is provided in the first section A1. That is, the signal conductor layer 20 (the third metal foil layer) is provided in the first region A11. The signal conductor layer 20 is located on the upper main surface of the insulating layer 14b.

The signal conductor layer 20a (a fourth metal foil layer) is provided in the multilayer body 12. The signal conductor layer 20a is provided in the second section A2, the third section A3, and the fourth section A4. That is, the signal conductor layer 20a is provided in the second region A12. The signal conductor layer 20a is located on the lower main surface of the insulating layer 14b. The signal conductor layer 20a is fixed to the lower main surface of the insulating layer 14b. In the second region A12, the distance D6 between the signal conductor layer 20a (the fourth metal foil layer) and the lower main surface (the second main surface) of the multilayer body 12 is shorter than the distance D5 between the signal conductor layer 20a (the fourth metal foil layer) and the upper main surface (the first main surface) of the multilayer body 12. In the second region A12, the signal conductor layer 20a (the fourth metal foil layer) is located farther on the outer peripheral side than the center of the multilayer body 12 in the laminating direction. The signal conductor layer 20 and the signal conductor layer 20a are connected at the boundary between the first section A1 and the second section A2 by an interlayer connection conductor.

When viewed in the up-down direction (the laminating direction), a plurality of streaks extending in a fourth direction DIR4 is provided on the lower main surface of the signal conductor layer 20a (the fourth metal foil layer). The plurality of streaks is provided on the entire lower main surface of the signal conductor layer 20a. The fourth direction DIR4 is the front-back direction. As a result, in a state in which the multilayer body 12 is shown on a plane, when viewed in the up-down direction (the laminating direction), an angle $\theta 42$ defined by the fourth direction DIR4 and the second bending line L2 is larger than an angle $\theta 41$ defined by the fourth direction DIR4 and the first bending line L1. Therefore, the surface roughness of the lower main surface of the signal conductor layer 20a in a direction parallel to the second bending line L2 is larger than the surface roughness of the lower main surface of the signal conductor layer 20a in a direction parallel to the first bending line L1. Other structures of the multilayer substrate 10f are the same as the structures of the multilayer substrate 10, and thus the description will be omitted. The multilayer substrate 10f can exhibit the same effects as the multilayer substrate 10.

In addition, according to the multilayer substrate 10f, breakage of the signal conductor layer 20a is reduced or prevented. In more detail, in the second region A12, the distance D6 between the signal conductor layer 20a and the lower main surface of the multilayer body 12 is shorter than the distance D5 between the signal conductor layer 20a and the upper main surface of the multilayer body 12. In the second region A12, the signal conductor layer 20a (the fourth metal foil layer) is located farther on the outer peripheral side than the center of the multilayer body 12 in the laminating direction. Therefore, in the second region A12, large tensile stress is applied to the signal conductor layer 20a. Therefore, in a state in which the multilayer body 12 is shown on a plane, when viewed in the up-down direction (the laminating direction), the angle $\theta 42$ defined by the fourth direction DIR4 and the second bending line L2 is larger than the angle $\theta 41$ defined by the fourth direction DIR4 and the first bending line L1. As a result, even when large tensile stress is applied to the signal conductor layer 20a, breakage of the signal conductor layer 20a is reduced or prevented.

Seventh Modification

Hereinafter, a multilayer substrate 10g according to a seventh modification of a preferred embodiment of the present invention will be described with reference to the drawings. FIG. 21 is a top view of the multilayer substrate 10g.

The multilayer substrate 10g is different from the multilayer substrate 10c in the location of the fourth bending line L4. In more detail, the fourth bending line L4 is located in the third section A3. Other structures of the multilayer substrate are the same as the structures of the multilayer substrate 10c, and thus the description will be omitted. The multilayer substrate can exhibit the same effects as the multilayer substrate 10c.

Other Preferred Embodiments

Multilayer substrates according to preferred embodiments of the present invention is not limited to the multilayer substrates 10, and 10a to 10g, and can be modified within the range of the concept of the present invention. Note that the configurations of the multilayer substrates 10, and 10a to 10g may be appropriately combined.

Note that in the multilayer substrates 10, and 10a to the signal conductor layers 20, 20a, and 120 are not essential components.

Note that in the multilayer substrate 10b, the thickness of the multilayer body 12 in the laminating direction in the second region A12 may be smaller than the thickness of the multilayer body 12 in the laminating direction at least in a portion of the region excluding the first region A11 and the second region A12. In addition, the thickness of the multilayer body 12 in the laminating direction in the first region A11 and the thickness of the multilayer body 12 in the laminating direction in the second region A12 may be smaller than the thickness of the multilayer body 12 in the laminating direction at least in a portion of the region excluding the first region A11 and the second region A12.

Note that the multilayer substrates 10, and 10a to 10g do not have to have a belt shape when viewed in the up-down direction. The multilayer substrates 10, and 10a to 10g may have, for example, a rectangular shape when viewed in the up-down direction.

Note that the plurality of streaks may be provided on the lower main surface of the reference conductor layer 22. The plurality of streaks may be provided on the upper main surface of the reference conductor layer 24.

Note that in the multilayer substrates 10, and 10a to the insulating layers 16a and 16b are not essential components. An insulating layer made of the same material as the insulating layer 14a may be laminated on the insulating layer 14a.

Note that in the multilayer substrate 10, in a state in which the multilayer body 12 is shown on a plane, when viewed in the up-down direction, the angle θ31 defined by the third direction DIR3 and the first bending line L1 may be equal to or less than the angle θ32 defined by the third direction DIR3 and the second bending line L2.

Note that in the multilayer substrate 10a, in a state in which the multilayer body 12 is shown on a plane, when viewed in the up-down direction, the angle θ32 defined by the third direction DIR3 and the second bending line L2 may be equal to or less than the angle θ31 defined by the third direction DIR3 and the first bending line L1.

Note that in the multilayer substrate 10f, in a state in which the multilayer body 12 is shown on a plane, when viewed in the up-down direction, the angle θ42 defined by the fourth direction DIR4 and the second bending line L2 may be equal to or less than the angle θ41 defined by the fourth direction DIR4 and the first bending line L1.

Note that the signal conductor layers 20, 20a, and 120 of the multilayer substrates 10, and 10a to 10g each may be a power supply conductor layer to which a power supply voltage is applied, a reference conductor layer to which a reference potential is connected, or the like.

Note that the reference conductor layers 22 and 24 of the multilayer substrates 10, and 10a to 10g each may be a power supply conductor layer to which a power supply voltage is applied, a signal conductor layer through which a radio frequency signal is transmitted, or the like.

Note that a metal foil formed by rolling metal may be used to form the signal conductor layers 20, 20a, and 120, and the reference conductor layers 22 and 24. A plurality of streaks is also formed on the metal foil formed by rolling. The streaks formed on the metal foil formed by rolling is described in Japanese Unexamined Patent Application Publication No. 2010-227971, for example.

Note that the material of the insulating layers 14a to 14c may be a resin other than a thermoplastic resin.

Note that the interlayer connection conductors v1 to v3, and vii each may be a through-hole conductor having a structure in which a conductor is formed, by plating, on the inner peripheral surface of a through-hole formed in each of the insulating layers 14a to 14c.

Note that in the multilayer substrate 10b, when viewed in the up-down direction (the laminating direction), the plurality of streaks extending in the fifth direction DIR5 is provided on the main surface of the reference conductor layer 22. The fifth direction DIR5 may be a direction other than the front-back direction. The fifth direction DIR5 may be, for example, the left-right direction.

Note that in the specification, an angle indicates an acute angle inside an obtuse angle or an acute angle defined through intersection of two lines.

Note that in the multilayer substrate 10c and 10g, it is sufficient as long as one of the followings is satisfied; "the curvature radius of the third region A13 is larger than the curvature radius of the first region A11", "the curvature radius of the third region A13 is larger than the curvature radius of the second region A12", "the curvature radius of the fourth region A14 is larger than the curvature radius of the second region A12", and "the curvature radius of the fourth region A14" is larger than the curvature radius of the first region A11. However, it is preferable to satisfy "the curvature radius of the third region A13 is larger than the curvature radius of the first region A11" and "the curvature radius of the fourth region A14 is larger than the curvature radius of the first region A11". In addition, it is preferable to satisfy "the curvature radius of the third region A13 is larger than the curvature radius of the second region A12" and "the curvature radius of the fourth region A14 is larger than the curvature radius of the first region A11".

Note that in the multilayer substrate 10, the surface roughness of the main surface of the reference conductor layer 22 (the first metal foil layer) and the surface roughness of the main surface of the reference conductor layer 24 (the second metal foil layer) may be larger than the surface roughness of the main surface of the signal conductor layer 20 (the third metal foil layer). In more detail, the surface roughness of the upper main surface of the reference conductor layer 22, the surface roughness of the lower main surface of the reference conductor layer 22, the surface roughness of the upper main surface of the reference conductor layer 24, and the surface roughness of the lower main surface of the reference conductor layer 24 are larger than the surface roughness of the lower main surface of the signal conductor layer 20 and the surface roughness of the lower main surface of the signal conductor layer 20. In particular, the lower main surface of the reference conductor layer 22 is in contact with the insulating layer 14a and the upper main surface of the reference conductor layer 24 is in contact with the insulating layer 14c. Therefore, the surface roughness of the lower main surface of the reference conductor layer 22 and the surface roughness of the upper main surface of the reference conductor layer 24 are larger than the surface roughness of the upper main surface of the signal conductor layer 20 and the surface roughness of the lower main surface of the signal conductor layer 20. As a result, the reference conductor layer 22 is less likely to be separated from the insulating layer 14a. Similarly, the reference conductor layer 24 is less likely to be separated from the insulating layer 14c. However, the upper main surface of the reference conductor layer 22 may be in contact with an insulating layer, and the lower main surface of the reference conductor layer 24 may be in contact with an insulating layer. In this case, the surface roughness of the upper main surface of the reference conductor layer 22 and the surface roughness of the lower main surface of the reference conductor layer 24 may be larger than the surface roughness of the lower main surface of the signal conductor layer 20 and the surface roughness of the lower main surface of the signal conductor layer 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a multilayer body including a plurality of insulating layers laminated together, and a first main surface and a second main surface arranged in a laminating direction of the plurality of insulating layers;
   a first metal foil layer provided in the multilayer body and including a main surface on which a plurality of streaks extending in a first direction, when viewed in the laminating direction, is provided; and
   a second metal foil layer provided in the multilayer body and including a main surface on which a plurality of streaks extending in a second direction, which is different from the first direction, when viewed in the laminating direction, is provided; wherein the multilayer body includes a first region in which the multilayer body is bent along a first bending line such that the first main surface is located farther on an outer peripheral side than the second main surface, and a second region in which the multilayer body is bent along a second bending line such that the first main surface is located farther on an inner peripheral side than the second main surface;

the second bending line is not parallel to the first bending line;

in the first region, the first metal foil layer is located farther on an outer peripheral side than a center of the multilayer body in the laminating direction;

in the second region, the second metal foil layer is located farther on the outer peripheral side than the center of the multilayer body in the laminating direction;

in a state in which the multilayer body is shown on a plane, when viewed in the laminating direction, an angle defined by the first direction and the first bending line is larger than an angle defined by the first direction and the second bending line; and in a state in which the multilayer body is shown on a plane, when viewed in the laminating direction, an angle defined by the second direction and the second bending line is larger than an angle defined by the second direction and the first bending line.

2. The multilayer substrate according to claim 1, further comprising:

a third metal foil layer provided in the multilayer body and including a main surface on which a plurality of streaks extending in a third direction, when viewed in the laminating direction, is provided; wherein in the first region, the third metal foil layer is located farther on the outer peripheral side than the center of the multilayer body in the laminating direction; and in a state in which the multilayer body is shown on a plane, when viewed in the laminating direction, an angle defined by the third direction and the first bending line is larger than an angle defined by the third direction and the second bending line.

3. The multilayer substrate according to claim 2, further comprising:

a fourth metal foil layer provided in the multilayer body and including a main surface on which a plurality of streaks extending in a fourth direction, when viewed in the laminating direction, is provided; wherein in the second region, the fourth metal foil layer is located farther on the outer peripheral side than the center of the multilayer body in the laminating direction; and in a state in which the multilayer body is shown on a plane, when viewed in the laminating direction, an angle defined by the fourth direction and the second bending line is larger than an angle defined by the fourth direction and the first bending line.

4. The multilayer substrate according to claim 3, wherein a surface roughness of the main surface of the first metal foil layer and a surface roughness of the main surface of the second metal foil layer are smaller than a surface roughness of the main surface of the third metal foil layer.

5. The multilayer substrate according to claim 3, wherein a surface roughness of the main surface of the first metal foil layer and a surface roughness of the main surface of the second metal foil layer are larger than a surface roughness of the main surface of the third metal foil layer.

6. The multilayer substrate according to claim 2, wherein the third metal foil layer is a signal conductor layer through which a signal is transmittable.

7. The multilayer substrate according to claim 1, wherein the multilayer body includes a third region in which the multilayer body is bent along a third bending line such that the second main surface is located farther on the outer peripheral side than the first main surface;

in the third region, the second metal foil layer is located farther on the outer peripheral side than the center of the multilayer body in the laminating direction;

in a state in which the multilayer body is shown on a plane, when viewed in the laminating direction, an angle defined by the second direction and the third bending line is smaller than the angle defined by the second direction and the second bending line; and a curvature radius of the third region is larger than a curvature radius of the first region.

8. The multilayer substrate according to claim 7, wherein the multilayer body further includes a fourth region in which the multilayer body is bent along a fourth bending line such that the first main surface is located farther on the outer peripheral side than the second main surface;

in the fourth region, the first metal foil layer is located farther on the outer peripheral side than the center of the multilayer body in the laminating direction;

in a state in which the multilayer body is shown on a plane, when viewed in the laminating direction, an angle defined by the first direction and the fourth bending line is smaller than the angle defined by the first direction and the first bending line; and a curvature radius of the fourth region is larger than a curvature radius of the second region.

9. The multilayer substrate according to claim 1, wherein the multilayer body includes a third region in which the multilayer body is bent along a third bending line such that the second main surface is located farther on the outer peripheral side than the first main surface;

in the third region, the second metal foil layer is located farther on the outer peripheral side than the center of the multilayer body in the laminating direction;

in a state in which the multilayer body is shown on a plane, when viewed in the laminating direction, an angle defined by the second direction and the third bending line is smaller than the angle defined by the second direction and the second bending line; and a curvature radius of the third region is larger than a curvature radius of the second region.

10. The multilayer substrate according to claim 9, wherein the multilayer body includes a fourth region in which the multilayer body is bent along a fourth bending line such that the first main surface is located farther on the outer peripheral side than the second main surface;

in the fourth region, the first metal foil layer is located farther on the outer peripheral side than the center of the multilayer body in the laminating direction;

in a state in which the multilayer body is shown on a plane, when viewed in the laminating direction, an angle defined by the first direction and the fourth bending line is smaller than the angle defined by the first direction and the first bending line; and a curvature radius of the fourth region is larger than a curvature radius of the first region.

11. The multilayer substrate according to a claim 1, wherein the first metal foil layer and the second metal foil layer are reference conductor layers connected to a reference potential.

12. The multilayer substrate according to claim 1, wherein at least one of a thickness of the multilayer body in the laminating direction in the first region or a thickness of the multilayer body in the laminating direction in the second region is smaller than a thickness of the multilayer body in the laminating direction at least in a portion of a region excluding the first region and the second region.

13. An electronic device comprising the multilayer substrate according to claim 1.

14. A multilayer substrate comprising:
- a multilayer body including a plurality of insulating layers laminated in a laminating direction;
- a first metal foil layer provided in the multilayer body and including a main surface on which a plurality of streaks extending in a first direction, when viewed in the laminating direction, is provided; and
- a second metal foil layer provided in the multilayer body and including a main surface on which a plurality of streaks extending in a second direction, which is different from the first direction, when viewed in the laminating direction, is provided; wherein
- the multilayer body is bent in the laminating direction.

15. The multilayer substrate according to claim 14, wherein
- the multilayer body includes a first region in which the multilayer body is bent along a first bending line, and a second region having a structure in which the multilayer body is bent along a second bending line; and
- the second bending line is not parallel to the first bending line.

16. The multilayer substrate according to claim 15, wherein
- the multilayer body includes a first main surface and a second main surface arranged in the laminating direction of the plurality of insulating layers;
- the first region has a structure in which the multilayer body is bent along the first bending line such that the first main surface is located farther on an outer peripheral side than the second main surface;
- in the first region, the first metal foil layer is located farther on an outer peripheral side than a center of the multilayer body in the laminating direction; and
- in a state in which the multilayer body is shown on a plane, when viewed in the laminating direction, the first direction intersects with the first bending line.

17. The multilayer substrate according to claim 15, wherein at least one of a thickness of the multilayer body in the laminating direction in the first region or a thickness of the multilayer body in the laminating direction in the second region is smaller than a thickness of the multilayer body in the laminating direction at least in a portion of a region excluding the first region and the second region.

18. The multilayer substrate according to claim 14, wherein a surface roughness of the main surface of the first metal foil layer and a surface roughness of the main surface of the second metal foil layer are smaller than a surface roughness of the main surface of the third metal foil layer.

19. The multilayer substrate according to claim 14, wherein the first metal foil layer and the second metal foil layer are reference conductor layers connected to a reference potential.

20. An electronic device comprising the multilayer substrate according to claim 14.

* * * * *